US 6,700,369 B1

(12) United States Patent
Makuuchi et al.

(10) Patent No.: US 6,700,369 B1
(45) Date of Patent: Mar. 2, 2004

(54) TESTING APPARATUS OF MAGNETIC RECORDING MEDIUM OR MAGNETIC HEAD INCLUDING A PLURALITY OF ANALOG-TO-DIGITAL CONVERTERS WHICH CONVERT REPRODUCED TESTING DATA INTO DIGITAL DATA

(75) Inventors: Masami Makuuchi, Yokohama (JP); Ritsurou Orihashi, Yokohama (JP); Norio Chujo, Shibuya (JP); Masayoshi Takahashi, Yokohama (JP); Yoshihiko Hayashi, Setagaya (JP); Shinji Homma, Ashigarakami (JP)

(73) Assignees: Hitachi, Ltd., Tokyo (JP); Hitachi Electronics Engineering Co., Ltd., Tokyo (JP)

( * ) Notice: Subject to any disclaimer, the term of this patent is extended or adjusted under 35 U.S.C. 154(b) by 202 days.

(21) Appl. No.: 09/722,298

(22) Filed: Nov. 28, 2000

(30) Foreign Application Priority Data

Dec. 22, 1999 (JP) .......................................... 11-365362

(51) Int. Cl.$^7$ .............................................. G01R 33/12
(52) U.S. Cl. ............................. 324/212; 360/53; 360/31
(58) Field of Search ................................ 324/210, 212, 324/211; 360/313, 53, 31; 369/53.35, 69, 53.17, 53.24, 53.44; 714/719

(56) References Cited

U.S. PATENT DOCUMENTS 4,881,136 A * 11/1989 Shiraishi et al. ............ 324/212
5,256,965 A * 10/1993 Nomura ...................... 324/212
5,668,477 A * 9/1997 Mahmoudian et al. ...... 324/613
5,760,982 A * 6/1998 Stein ........................... 360/31
5,812,560 A   9/1998 Yuki
5,838,153 A * 11/1998 Inbar .......................... 324/212
6,014,282 A * 1/2000 Ito .............................. 324/210
6,304,081 B1 * 10/2001 Richter ....................... 324/210
6,336,001 B1 * 1/2002 Kawamura et al. .......... 386/85

FOREIGN PATENT DOCUMENTS

| JP | 63098574  |   | 4/1988  |
|----|-----------|---|---------|
| JP | 05282615  |   | 10/1993 |
| JP | 07169001  |   | 7/1995  |
| JP | 07220201  |   | 8/1995  |
| JP | 09270101  |   | 10/1997 |
| JP | 10-083501 | * | 3/1998  |

* cited by examiner

Primary Examiner—Jay Patidar
(74) Attorney, Agent, or Firm—Antonelli, Terry, Stout & Kraus, LLP

(57) ABSTRACT

A testing apparatus of a magnetic recording medium for conducting a test on the magnetic recording medium by using reproduced data obtained through reproduction of the magnetic medium, including a plurality of conversion means for converting the reproduced data into digital data, holding means for holding the digital data converted by the plurality of conversion means, data processing means for performing a calculation process on the digital data held by the holding means in relation to a magnetic characteristic of the magnetic recording medium, and analysis processing means for performing an analysis to determine whether or not information obtained by the data processing means satisfies a certain condition.

30 Claims, 11 Drawing Sheets

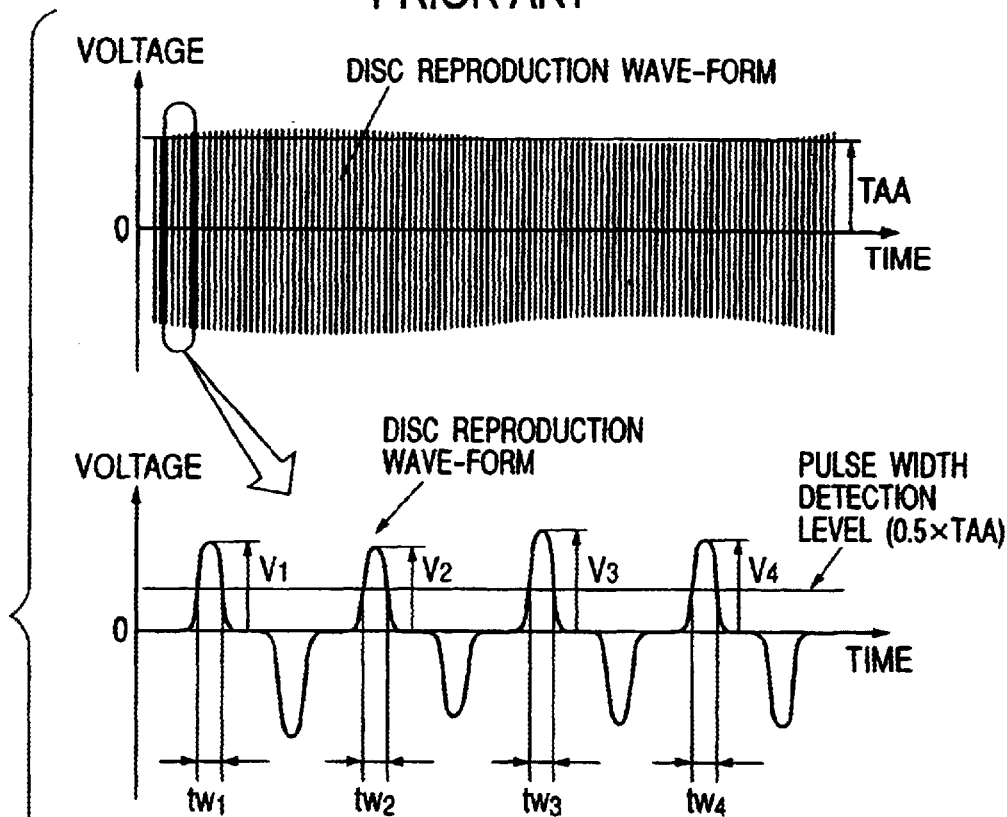

TESTING APPARATUS OF MAGNETIC RECORDING MEDIUM OR MAGNETIC HEAD INCLUDING A PLURALITY OF ANALOG-TO-DIGITAL CONVERTERS WHICH CONVERT REPRODUCED TESTING DATA INTO DIGITAL DATA

BACKGROUND OF THE INVENTION

The present invention relates to a testing apparatus of a magnetic recording medium or a magnetic head, for testing the magnetic recording medium or the magnetic head, which are able in write-in and read-out.

Conventionally, in information processing apparatuses, such as a work station, etc., magnetic recording apparatuses have been used as an outer recording apparatus thereof. It is well-known that, in particular, magnetic disc devices are developed, due to improvement on magnetic substance or on a magnetic head and also due to progress on signal processing technology, in high density of recording and high frequency of recording, as well as in lowering of the price thereof, in recent years, and it bears a burden of high speed and price-lowering of the information processing apparatuses.

Also, the magnetic disc apparatuses are required to be high in the reliability on data being recorded/reproduced, as the outer recording apparatuses, then for testing the magnetic disc or the magnetic head which is applied into a magnetic disc apparatus, a method is often used, in which the testing is carried out by recording/reproducing the test data with use of the magnetic disc or the magnetic head, at the frequency being used in actual practice.

In particular, with the magnetic disc, evaluation and testing are carried out on the disc as an object to be tested, by recording/reproducing the test data which is recorded on the magnetic disc, for example by performing a parametric test, wherein is measured TAA (Track Average Amplitude) as an average amplitude of a disc reproducing signal, such as shown in FIG. 11, as a test parameter recommended by the International Disc Drive Equipment and Materials Association (IDEMA), or PW50 as an average pulse width of the disc reproducing signal at a point of 50% of the average amplitude (TAA).

Also, the evaluation and testing are carried out on the disc as the object to be tested, by performing a certify test, wherein is detected a missing error, in which the amplitude of the disc reproducing signal is reproduced at a unit of data pulse and with an amplitude being too much smaller than the averaged amplitude of the disc reproducing signal when conducting the write-in/read-out of constant frequency data onto the magnetic disc, or a spike error, in which it is reproduced with the amplitude being too much larger than the average amplitude, etc.

FIG. 10 is a drawing for showing the structure of a testing apparatus of the magnetic recording medium or the magnetic head, according to the conventional art.

In the testing apparatus shown in the FIG. 10, first a magnetic disc 101 as the object to be tested is operated to rotate by a disc rotation portion 103, on the contrary to this, a test signal St of frequency fo is generated in a test signal generator circuit 602, so as to be added to a write-in controller circuit 603, wherein a test data is produced in the write-in controller circuit 603, being converted into a write-in current at a certain level in a write-in/read-out amplifier 601, and is written one by one onto the magnetic disc 101 through a R/W head 102 which was acknowledged to be a good-qualified one or was known in the magnetic characteristics thereof.

After completing the write-in, from the track on the magnetic disc 101 onto which the test data is written, the disc reproduction signal is reproduced by the R/W head 102 through the read-in/write-out amplifier 601 as two (2) signals of a positive phase and a negative phase, to be sent to an amplifier (AMP) 604 for level adjusting. Those two (2) disc reproducing signals Ss1 and Ss2 (each being a signal of frequency fo and corresponding to the test signal St), being adjusted in the level there, are inputted into a TAA detection circuit 605, a PW detection circuit 605 and a wave-form comparator circuit 608.

The TAA detection circuit 605 is constructed with using, for example, a voltage comparator circuit (comparator), a controlled current source, a capacitor and a one-turn track integrator circuit (not shown in the figure), wherein the voltage for charging the capacitor and the voltage of the disc reproducing wave-form are compared with, so that an envelope voltage in vicinity of a peak value of the disc reproducing signal is detected while controlling the controlled current source by means of the comparator, so as to charge the capacitor when the voltage of the disc reproducing wave-form is higher than the voltage for charging the capacitor, thereby detecting an integrated value of the envelope voltage for the period of one-turn or one-round of the track by means of the one-turn track integrator circuit.

Conducting dividing process upon the integrated value of the envelope voltage by the time for one-turn of the track, namely by treating averaging process onto the envelope voltage of the disc reproducing signal, the average amplitude value TAA of the disc reproducing signal is detected, so as to be outputted to a slice level producing circuit 606.

Also, a CPU 111 of a controller portion 110 reads the average amplitude value TAA, being the output of the TAA detection circuit, so as to perform measurement of TAA.

In the slice level producing circuit 606, the voltage of 50% with respect to the voltage level of the TAA is set to be a threshold value (i.e., a slice level), as a slice setting 1, to provide an output into a PW detector circuit 607, while, by means of a control signal P outputted by the CPU 111 of the controller portion 110, the voltage value of P% with respect to the voltage level of the TAA is outputted into the wave-form comparator circuit 608, as the slice setting 2.

The PW detector circuit 607 is constructed with, for example a voltage comparator circuit (comparator), a controlled current source, a capacitor and a one-round track integrator circuit (not shown in the figure), wherein the controlled current source is controlled by the comparator, so that the capacitor is charged up only for the time when the disc reproducing signal mentioned above exceeds the slice setting 1, to integrate the capacitor charging voltage for the period of one-turn or one-round of the track in the one-turn track integrator circuit, thereby detecting the integrated value (voltage) of the pulse widths.

The CPU 111 of the controller portion 110 measures the averaged pulse width PW 50 mentioned above, through conducting the dividing process upon the integrated value (voltage) of the pulse widths as the output of the PW detector circuit 607 by the charge current value of the controlled current source and the number of pulses of the disc reproducing signal for the period of one-turn of the track.

The wave-form comparator circuit 608 is constructed with, for example a voltage comparator circuit (comparator), and outputs a comparison result between the voltage value of the above-mentioned disc reproducing signal and the voltage value of the slice setting 2, as a detection signal to an error detection circuit 609. The error detection circuit 609 is constructed with gate circuits, wherein a window pulse is generated for detecting the peak position of the disc reproducing signal pulse, only for a predetermined set period upon the basis of a timing signal T corresponding to each bit of the test data which is sent from the test signal generator circuit 602 mentioned above, while detecting an error, such as the missing error and/or the spike error, etc., from the detection signal as the output of the wave-form comparator circuit 608 and the window pulse, thereby outputting a bit error signal Er to an error memory 610 in synchronism with the each bit of the timing signal T. The error detection circuit 609 also receives the control signal P from the CPU 111 of the controller portion 110, and is changed in the operation condition thereof depending upon the kinds or sorts of errors, so as to detect the each error, such as the missing error and/or the spike error, etc.

The error memory 610 changes the address thereof sequentially, while receiving the timing signal T generated by the test signal generator circuit 602, and also memorizes the error signal Er which is outputted by the error detection circuit 609 into the renewed address, as a defect data, "1" or "0", sequentially. The CPU 111 reads the contents of the error memory 610 at the time point when the test is completed on all rounds of the magnetic disc 101 as the object to be tested, through a bus into a memory 112, so as to conduct the evaluation of the magnetic disc 101.

Though the above-mentioned is for the magnetic disc as the object to be tested, however when the object to be tested is a magnetic head, the evaluation on the R/W head 102 as the magnetic head is carried out, with using the magnetic disc which was acknowledged to be a good-qualified one or is known in the magnetic characteristics thereof, under the same construction.

Accordingly, with the testing apparatus of the magnetic recording medium or the magnetic head according to the conventional art, shown in the FIG. 10, by performing the circuit operation mentioned above onto the magnetic disc 101 as the object to be tested, it measures the TAA or the PW50, thereby to realizes the prametric test, or it measures the missing error or the spike error, thereby to realize the certify test. As the prior art relating to the present technology, for example, in Japanese Patent Laying-Open No. Hei 10-83501 (1998) is mentioned an outline of the conventional certifier.

SUMMARY OF THE INVENTION

However, with the testing apparatus of the magnetic recording medium or the magnetic head of analogue method, according to the conventional art, there is given no consideration on measuring restrictively the TAA shown in the FIG. 1, for example for detecting the value of amplitude of the disc reproducing signal, with using the envelope detector circuit, as was mentioned in the above, nor consideration of conducting the test with details and at high accuracy onto the magnetic disc, by detecting the pulse width or the value of amplitude, etc., for example, on an arbitrary number of discontinuous pulses of the disc reproducing signal, for measuring the TAA and the PW50 from the disc reproducing signal by treating the averaging process thereon with using the one-turn track integrator circuit.

Also, in the testing apparatus of the magnetic recording medium or the magnetic head with using the conventional analogue method, when the disc reproducing signal comes to be a high frequency wave, the response of the comparator in the TAA detector circuit, for example, is too late to the changing of an input, then the accuracy is deteriorated in detecting the TAA. In a case where the TAA is measured at the detecting accuracy being same to that of the conventional method, so as to meet with tendency of high frequency on the magnetic disc in future, for example, there is a necessity for the comparator, having a performance of gain 54 db/frequency bandwidth 2 GHz at the present, to be improved in IC process performance more than 8 GHz in the frequency bandwidth thereof, i.e., more than four (4) times lager than that, however it is difficult to realize it with the present IC process technology. Accordingly, with the conventional method, there is a possibility that the test of the magnetic disc or the magnetic head cannot be performed with high accuracy at the frequency where it is practiced actually, in particular for the tendency of high frequency of the magnetic disc apparatus in future, namely there is a problem that the test cannot be carried out at high speed/high accuracy, and that the magnetic disc or the magnetic head as the object to be tested is decreased down in the reliability thereof.

Also, in the testing apparatus of the magnetic recording medium or the magnetic head with using the conventional analogue method, there is a testing method to cope with the tendency of high frequency of the magnetic disc apparatus, in which the digital reproducing signal is observed on the wave-form with using a digital sampling oscilloscope, etc., however it has a problem that it is impossible to measure the disc reproducing signal, with observing the wave-form there of by means of the digital sampling oscilloscope, in particular for the write-in of an arbitrary and aperiodic test data. Also, even in a case of measuring the wave-form of the disc reproducing signal by means of the digital sampling oscilloscope, etc., with using a periodic test data, there is a problem that it is impossible to achieve the high speed in the testing time, then throughput in the testing process of the magnetic disc is decreased down, therefore the price of the magnetic disc cannot be lowered, in particular when conducting the test on recording/reproducing of the test data onto/from all the tracks of the magnetic disc.

An object according to the present invention is to provide a testing apparatus of the magnetic recording medium or the magnetic head, with which the test can be realized on the magnetic disc or the magnetic head, with details and at high accuracy.

Also other object according to the present invention is to provide a testing apparatus of the magnetic recording medium or the magnetic head, with which the test can be realized on the magnetic disc or the magnetic head, with details thereof and at accuracy being much higher.

Also, other object according to the present invention is to provide a testing apparatus of the magnetic recording medium or the magnetic head, with which the test can be realized at high speed, in the testing apparatus of the magnetic recording medium or the magnetic head.

Also, other object according to the present invention is to provide a testing apparatus of the magnetic recording medium or the magnetic head, with which measurement of the value of average amplitude (TAA) and the average pulse width PW50 of the reproducing test data can be realized at high speed.

According to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, wherein:

said reproduced test data is converted into a digital value, and upon said converted digital data, a calculation process is conducted in relation to a magnetic characteristic of said magnetic recording medium from the converted digital value, thereby conducting the test on said magnetic recording medium or on said magnetic head.

Also, according to the present invention, there is provided a testing apparatus of a magnetic recording medium or of a magnetic head as defined in the above, wherein said calculation process is a statistic calculation process or a frequency analysis calculation process, in which a peak value of said reproduced test data or a threshold value time when exceeding or being below an arbitrary threshold value is measured with using said converted digital value, thereby to calculate out an average value or a dispersion value or a deviation value or a cumulative frequency about said peak value or said threshold value time.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, comprising:

a conversion means for converting the reproduced test data into a digital value, a holding means for holding the digital value converted by said conversion means, and a data processing means for conducting a calculation process in relation to a magnetic characteristic of said magnetic recording medium from said digital value held by said holding means, thereby conducting the test on said magnetic recording medium or on said magnetic head.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, comprising:

N number (N: an integer) of conversion means for converting the reproduced test data into digital values;

a sampling clock control means for operating said N number of said conversion means, at a predetermined sampling frequency for each one of said converter means;

N number of holding means for holding the digital values converted by said N number of the converter means; and a data processing means for conducting a calculation process in relation to a magnetic characteristic of said magnetic recording medium from said digital values held by said N number of the holding means, thereby conducting the test on said magnetic recording medium or on said magnetic head.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, comprising:

N number of conversion means for converting the reproduced test data into digital values;

a sampling clock control means for operating said N number of said conversion means, at a sampling frequency $f_{ADC}$ for each one of said converter means;

N number of holding means for holding the digital values converted by said N number of the converter means;

a data processing means for conducting a calculation process in relation to a magnetic characteristic of said magnetic recording medium from said digital values held by said N number of the holding means; and an analysis processing means for conducting determining process of said magnetic recording medium from an output of said data processing means, wherein N has a following relationship among M, being a ratio of a sampling frequency $f_s$ as a target with respect to a frequency $f_{in}$ of the reproduced test data, said frequency $f_{in}$, and a sampling frequency $f_{ADC}$ for operating said converter means, $$N \geq M \times f_{in}/f_{ADC}$$

and is an integer.

Also, according to the present invention, there is provided a testing apparatus of a magnetic recording medium or of a magnetic head, for conducting test on said magnetic recording medium or said magnetic head, through recording test data onto said magnetic recording medium by means of a magnetic head and reproducing said recorded test data by means of said magnetic head, so as to treat a predetermined process thereon, comprising:

a rotation control means for operating a holding rotation means for holding said magnetic recording medium to rotate, by an output of a first oscillation means for oscillating at a desired frequency;

a recording means for recording said test data onto said magnetic recording medium, by the magnetic head which is positioned opposing to said magnetic recording medium on said holding rotation means;

a reproducing means for reproducing said test data which is recorded onto said magnetic recording medium by said magnetic head;

N number of conversion means for converting the reproduced test data into digital values;

a reproduction signal distributing means for distributing said reproduced test data into said N number of the converter means to supply;

a sampling clock distributing means for operating said N number of the converter means, at a sampling frequency $f_{ADC}$ for each one of said converter means, by means of a clock signal based on a second oscillation means for oscillating at a desired frequency;

N number of holding means for holding the digital values converted by said N number of the converter means;

a data processing means for conducting a calculation process in relation to a magnetic characteristic of said magnetic recording medium from said digital values held by said N number of the holding means;

an analysis processing means for conducting determining process of said magnetic recording medium from an output of said data processing means; and a controller means for bringing the oscillating frequencies of said first oscillation means and said second oscillation means and the sampling frequency for operating said converter means to be changeable, wherein N has a following relationship among M, being a ratio of a sampling frequency $f_s$ as an object with respect to a frequency $f_{in}$ of the reproduced testing data, said frequency $f_{in}$, and a sampling frequency $f_{ADC}$ for operating said converter means, $$N \geq M \times f_{in}/f_{ADC}$$

and is an integer.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, comprising:

- a rotation control means for operating a holding rotation means for holding said magnetic recording medium to rotate, by an output of a first oscillation means for oscillating at a desired frequency;
- a mode and timing controller means for producing a write-in mode signal indicative of a start and an end of writing and a read-out mode signal indicative of a start and an end of reading, responding to a start signal and a stop signal, upon basis of an index signal indicative of a rotation number and an encode signal indicative of a rotating position from said rotation controller means;
- a recording means for recording said test data onto said magnetic recording medium, by the magnetic head which is positioned opposing to said magnetic recording medium on said holding rotation means, upon basis of said write-in mode signal;
- a reproducing means for reproducing said test data which is recorded onto said magnetic recording medium by said magnetic head, upon basis of said read-out mode signal;
- N number of conversion means for converting the reproduced testing data into digital values;
- a reproduction signal distributing means for distributing said reproduced test data into said N number of the converter means so supply;
- a sampling clock distributing means for operating said N number of the converter means, at a sampling frequency $f_{ADC}$ for each one of said converter means, by means of a clock signal based on a second oscillation means for oscillating at a desired frequency;
- N number of holding means for holding the digital values converted by said N number of the converter means;
- a data processing means for conducting a calculation process in relation to a magnetic characteristic of said magnetic recording medium from said digital values held by said N number of the holding means;
- an analysis processing means for conducting determining process of said magnetic recording medium from an output of said data processing means; and
- a controller means for bringing the oscillating frequencies of said first oscillation means and said second oscillation means and the sampling frequency for operating said converter means to be changeable, wherein N has a following relationship among M, being a ratio of a sampling frequency $f_s$ as an object with respect to a frequency $f_{in}$ of the reproduced testing data, said frequency $f_{in}$, and a sampling frequency $f_{ADC}$ for operating said converter means, $$N \geq M \times f_{in}/f_{ADC}$$

and is an integer.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, comprising:

- L (L: an integer being equal or greater than 2) number of reproducing means for reproducing said test data recorded onto said magnetic recording medium, as L number of separate signals, by means of L number of said magnetic heads which are positioned opposing to said magnetic recording medium;
- N (N: an integer being equal or greater than 2) number of conversion means for converting the reproduced test data into digital values;
- a reproduction signal distributing means for distributing said reproduced test data into said N number of the converter means to supply, by bringing into a desired connecting condition;
- a sampling clock distributing means for operating said N number of the converter means, at a sampling frequency $f_{ADC}$ for each one of said converter means;
- N number of holding means for holding the digital values converted by said N number of the converter means; and
- a data processing means for conducting a calculation process in relation to a magnetic characteristic of said magnetic recording medium from said digital values held by said N number of the holding means, thereby conducting the test on said magnetic recording medium or on said magnetic head.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, wherein:

said reproduced testing data is converted into a digital value, and upon said converted digital data, a calculation process is conducted in relation to a magnetic characteristic of said magnetic recording medium from the converted digital value, thereby conducting the test on said magnetic recording medium, and said calculation process comprises:

- a first frequency measuring means for selectively operating plural measuring means to measure, upon basis of said converted digital value;
- a first histogram processing means for measuring and outputting an average amplitude value of a reproduced wave-form by means of a histogram process, upon basis of an output of said first frequency measuring means;
- a coefficient means for multiplying a coefficient of ½ onto an output of said first histogram processing means;
- a comparator means for comparing an output of said coefficient means and an output of a converter means, to output a comparison result;
- a pulse counting means for operating to count a clock signal pulse oscillating at a desired frequency, only a period during when an output of said comparator means lies at a predetermined level;

a second frequency measuring means, being operative upon basis of change of an output of said comparator means, for selectively operating the plural measuring means to measure, upon basis of a pulse which is outputted by said pulse counting means; and a second histogram processing means for measuring and outputting an average amplitude value of the reproduced wave-form by means of a histogram process upon basis of an output of said second frequency measuring means, wherein the average amplitude value and the average pulse width of said reproduced wave-form during a desired time period is measured, thereby conducting the test on said magnetic recording medium or on said magnetic head.

Also, according to the present invention, there is provided a testing apparatus of a magnetic recording medium or of a magnetic head, for conducting test on said magnetic recording medium or said magnetic head, through recording test data onto said magnetic recording medium by means of said magnetic head and reproducing said recorded test data by means of said magnetic head, so as to treat a predetermined process thereon, wherein:

said reproduced testing data is converted into a digital value, and upon said converted digital data, a calculation process is conducted in relation to a magnetic characteristic of said magnetic recording medium from the converted digital value, thereby conducting the test on said magnetic recording medium, and said calculation process comprises:

a first frequency value holding means for measuring frequency, by adding data written into an address of a first memory corresponding to said converted digital value with using a first adder circuit and writing it into the same address, upon basis of said converted digital value;

a first histogram processing means for measuring and outputting an average amplitude value of a reproduced wave-form by means of a histogram process, upon basis of an output of said first frequency measuring means;

a threshold holding means for holding a predetermined threshold data;

a comparator means for comparing an output of said threshold holding means and an output of said converter means, so as to output a comparison result therefrom;

a pulse counting means for operating to count a clock signal pulse at a desired frequency, only a period during when an output of said comparator means lies at a predetermined level;

a second frequency holding means for measuring frequency, by adding data written into an address of a second memory corresponding to said converted digital value, with using a second adder circuit and by writing it into the same address, upon basis of an output of said pulse counting means; and a second histogram processing means for measuring and outputting a value of average amplitude of a reproduced wave-form, by means of a histogram calculation process, upon basis of an output of said first frequency measuring means, wherein the average amplitude value and the average pulse width of said reproduced wave-form during a desired time period is measured, thereby conducting the test on said magnetic recording medium or on said magnetic head.

BRIEF DESCRIPTION OF THE DRAWINGS

FIG. 11 is a view of explaining definition of the disc reproducing signal average amplitude (TAA) and the disc reproducing signal average pulse width (PW50) at a point of 50%, in connection with the disc reproducing signal.

DETAILED DESCRIPTION OF PREFERRED EMBODIMENTS

Hereinafter, embodiments according to the present invention will be fully explained by referring to the attached drawings.

Figure 1:
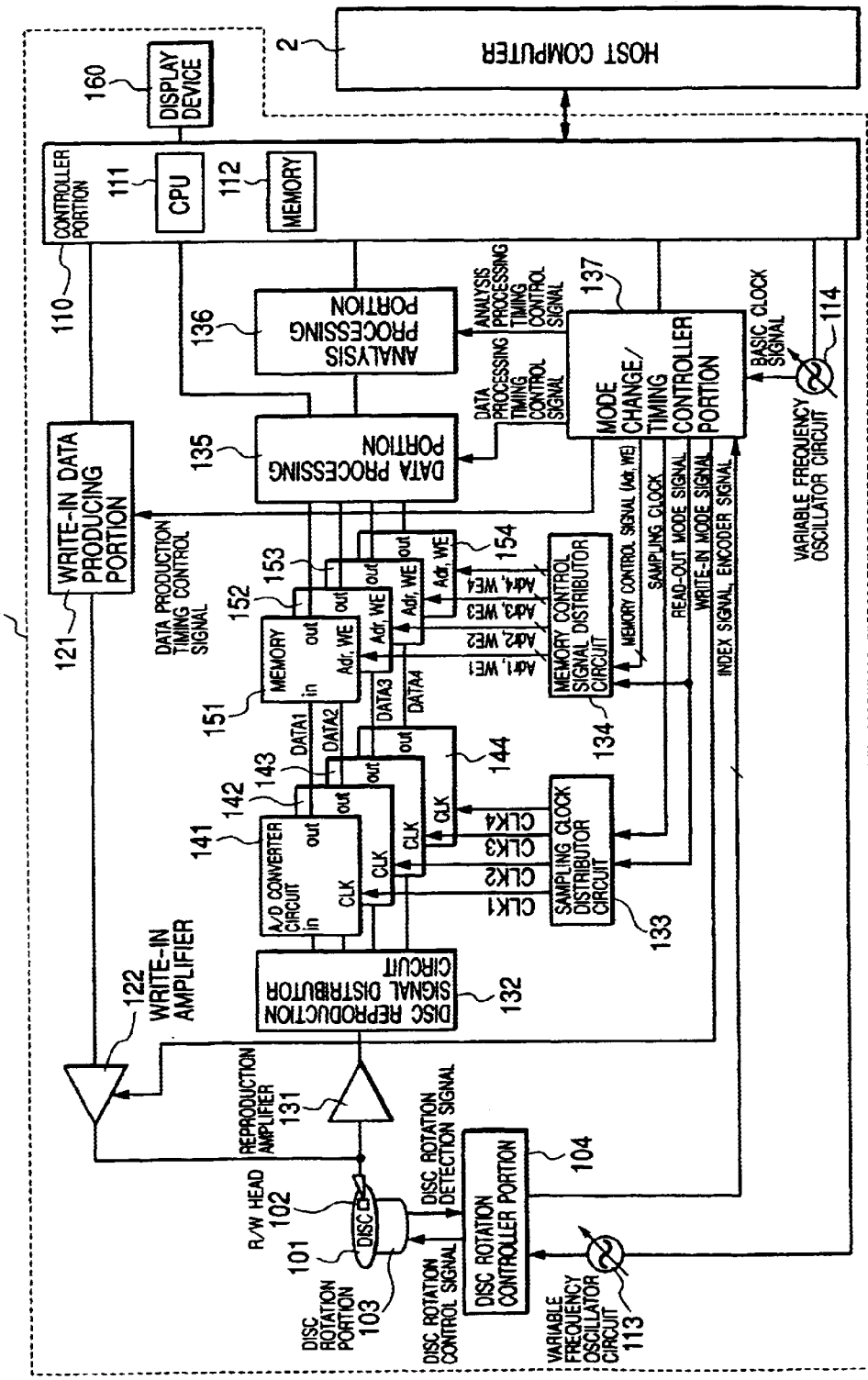
FIG. 1 is a view for showing a first embodiment of a testing apparatus for a magnetic recording medium or a magnetic head, according to the present invention.

FIG. 1 shows the structure of a first embodiment according to the present invention, i.e., the structure view of the testing apparatus of a magnetic recording medium or of a magnetic head, such as, through recording test data which is set for the magnetic recording medium, reproducing that test data recorded on that magnetic recording medium, thereby deciding whether it is good or bad quality of the magnetic recording medium or of the magnetic head with using the reproduction signal of that test data, or conducting measurement of characteristics thereof.

In the testing apparatus 1 of the magnetic recording medium or the magnetic head shown in FIG. 1, as a recording operation, a disc 101 as the magnetic recording medium is held on a disc rotating portion 103 so as to be rotated thereon, a test data for use in the testing is formed or produced in a write-in data producing portion 121 to be outputted, the output of the write-in data producing portion 121 being amplified in a write-in amplifier 122 to be outputted, a R/W head 102 being positioned on a track to be a testing target on the disc 101, and the write-in operation is performed onto the disc 101 having magnetic characteristics, by changing magnetic field of the R/W head upon basis of the output of the write-in amplifier 122, thereby recording the test data on the track as the test target on the disc 101 which is in the rotating operation, along with a circumference direction thereof.

Also, as a reproducing operation, the change in the magnetic field due to the test data which is recorded on the disc 101 being operated to rotate is detected by the R/W head 102, the disc reproduction signal is divided into 4 (N=4) by a disc reproduction signal distributor circuit 132, and each of the disc reproduction signal being divided into four (4) is converted into a digital value, independently, with using sampling clock signals being inputted, through A/D converter circuits 141–144 provided in a number of 4 (N=4), so as to be outputted, thereby the digital values outputted by the A/D converter circuits 141–144 are held in memories 151–154.

Upon the basis of the digitized data of the disc reproduction signal which is held in the memories 151–154, the measured value to be a target for the disc reproduction signal is calculated out by means of a calculation process in a data processing portion 135, so as to be outputted, and upon the measured value of the disc reproduction signal which is outputted by the data processing portion 135, a decision or discrimination operation for performing decision process by calculating out whether the disc to be the test target is normal or not is conducted in an analysis processing portion 136, thereby conducting the test on the magnetic disc or the magnetic head to be the test target.

A disc rotation controller portion 104 produces a disc rotation control signal, upon the basis of an output of a variable frequency oscillator circuit 113 oscillating at a predetermined frequency under control of a CPU 111 provided with in a controller portion 110, so as to control the disc 101 at a predetermined rotation number at constant, to the disc rotating portion 103. Since the CPU 111 controls the variable frequency oscillator circuit 113 mentioned above, as well as another variable frequency oscillator circuit 114 which will be mentioned later, independently, then the disc 101 is controlled, so that it operate to rotate at constant, independently, between when being written with the test data thereon and when being read out therefrom.

Also, the disc rotation controller portion 104 outputs an index signal (1 pulse output per 1 turn or revolution of the disc) or an encoder signal (for example, 1,024 or 2,048 pulse outputs per 1 turn or revolution of the disc) to a mode change/timing controller portion 137, upon the basis of a disc rotation number detection signal which is outputted by the disc rotation portion 103.

Figure 2:
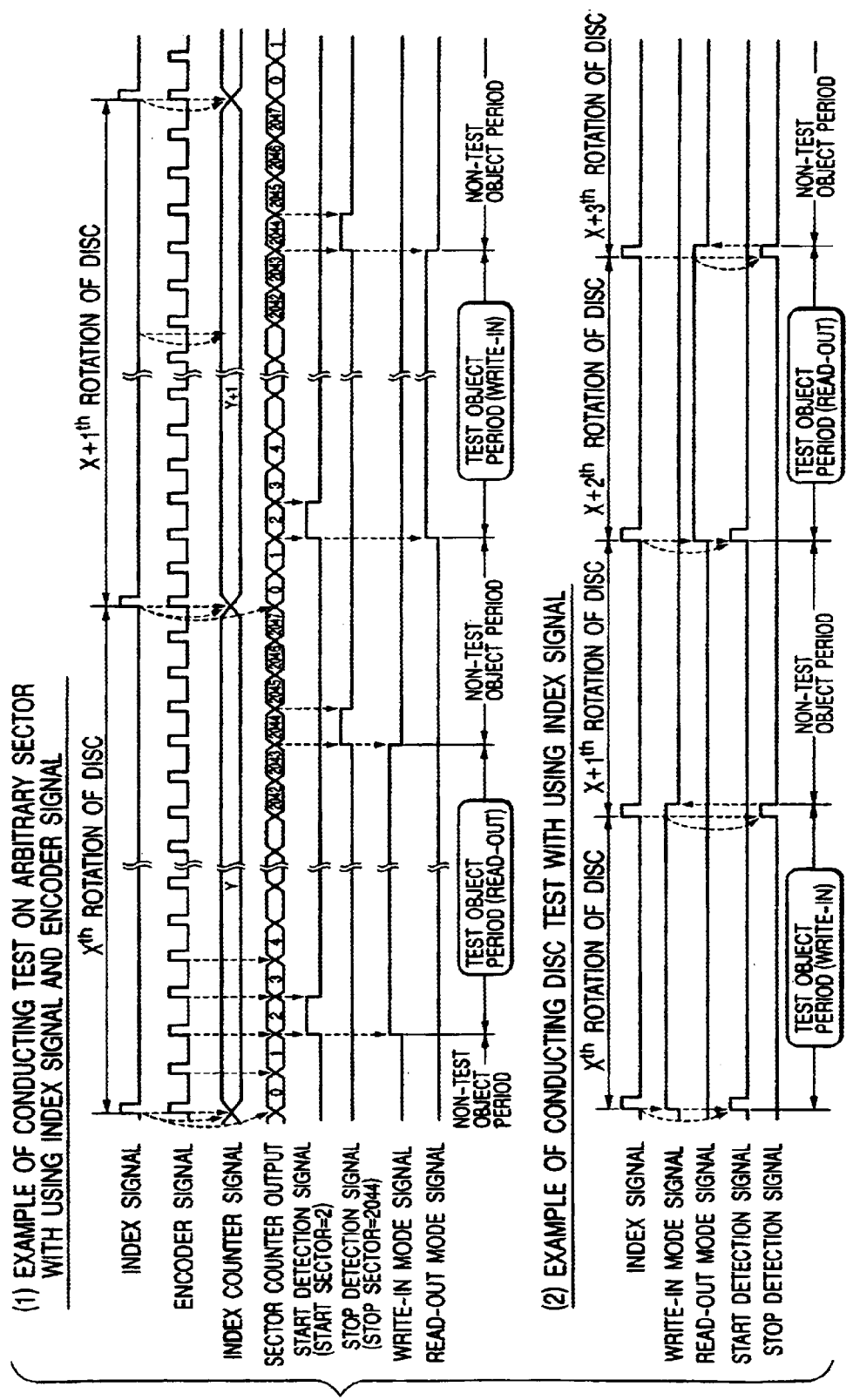
FIG. 2 is a view for showing operation of the apparatus shown in the FIG. 1.

The mode change/timing controller portion 137 receives a standard or basic clock signal, being as an output of the variable frequency oscillator circuit 114 which oscillates at the predetermined frequency under the control of the CPU 111 provided in the controller portion 110, so as to operate the circuits therein, and, in a recording reproduction sector discrimination portion (not shown in the figure) located inside thereof, there is provided a sector counter by means of a pulse counter circuit, such as a counter, etc., for example, wherein the sector counter is reset to "0" with using the index signal which is outputted by the disc rotation controller portion 104 and it is operated to count the pulse number of the encoder pulses, as shown in FIG. 2, thereby deciding or discriminating a sector position of that disc (hereinafter, being described only by "sector position") for conducting recording/reproducing of the test data by means of the R/W head 102.

Also, by comparing a start sector value being preset and a stop sector value with the sector value as an output value of the sector counter, to be coincident therewith, a start detection signal and a stop detection signal are generated, internally, wherein is decided the start/end timing of the write-in mode or the read-out mode to the disc 101, thereby conducting the production of the write-in mode signal or the read-out mode signal, so as to perform changing of the mode and timing control for each part of the testing apparatus.

FIG. 2(1) shows an example of testing an arbitrary sector with using the index signal and the encoder signal, and in particular, an example, in which the operation is performed on the decision of a period as the test target and the changing between the write-in mode signal/read-out mode signal, in a case where 2,048 pulses per one (1) turn of the disc are outputted as the encoder signal in the disc rotation controller portion 104, while setting the start sector value to be two (2) and the stop sector value to be 2,048.

Herein, each period of the modes of the write-in and the read-out is a predetermined time period which is determined by the testing apparatus 1, and they are set as the start sector value and the stop sector value in registers, etc., within the mode change/timing controller portion 137, through the CPU 111 by means of a test program which is held in a memory 112 inside the controller portion 110. By means of the recording reproduction sector determining portion mentioned above, which is provided within the mode change/timing controller portion 137, the start detection signal outputs a voltage level indicative of an effective condition during only the time period when the sector position and the start sector value are coincident with, while the stop detection signal outputs a voltage level indicative of an effective condition during only the time period when the sector position and the stop sector value are coincident with.

Accordingly, with the mode change/timing controller portion 137, it is possible to decide the time period from when the start detection signal pulse is outputted until to when the stop detection signal is outputted as the time period to be the test target, then as shown in the FIG. 2(1), it is possible to conduct the test onto an arbitrary sector on the disc 101, by producing the write-in mode signal during the period to be test target in Nth rotation of the disc, and producing the read-out mode signal during the period to be test target in N+1$^{th}$ rotation of the disc, for example.

Also, though not shown in the FIGS. 1 and 2, in particular, however, by adopting the construction, so that each of the start sector value and the stop sector value can be set for each mode, independently, when writing and reading the test data, in the recording production sector determination portion, it is possible to set the write-in period and the read-out period of the test data, independently. Also, by adding a function of deciding the disc rotation number with provision of a index signal counter circuit, it is possible to write and read the test data at an arbitrary rotation number and to an arbitrary sector.

Next, an example is shown, in which the disc test is conducted by use of only the index signal, in FIG. 2(2).

FIG. 2(2) shows an example, wherein the first index signal pulse is outputted as the start pulse when the write-in mode signal or the read-out mode signal is valid, and the pulse next to the index signal pulse which is used as the start pulse in the write-in or read-out mode is outputted as the stop pulse, thereby conducting the operation of the write-in or the read-out, i.e., conducting the test for each track of the magnetic disc 101.

In the FIG. 2(2), there is shown the example, where the start pulses are outputted at the Nth turn and N+2$^{th}$ turn of the disc 101, for example, and the stop pulses are outputted at the N+1$^{th}$ turn and N+3$^{th}$ turn of the disc 101. Herein, though the example is shown where the write-in or read-out operation is conducted by a unit of rotation to or from the disc 101, in the FIG. 2(2), however it is needless to say that the test is able onto an arbitrary sector, by providing a function of counting the sectors, in the same manner as shown in the FIG. 2(1), with provision of such the counter circuit operating with the clock signal at an arbitrary frequency, and operating to reset by the index signal, as well, in the recording reproduction sector discrimination portion.

Also, themode change/timing controller portion 137 performs the control on the three operation conditions of, such as, the write-in operation and the read-out operation into each portion of the testing apparatus 1 and the analysis processing operation, in addition to the sector discrimination operation mentioned above. Namely, during the first operation condition, i.e., the write-in operation, upon basis of the write-in mode signal which is produced through conducting the discrimination of the write-in sector by means of the sector detection function mentioned above, the mode change/timing controller portion 137 outputs the data producing timing signal being set to be equal to a recording bit frequency into the data producing portion 121, so as to perform the write-in data producing control, and also, for changing the write-in magnetic field depending on the test data in the R/W head 102, it controls an output terminal of the write-in amplifier 122 to be able to provide an output, by the write-in mode signal, thereby to control the write-in of the data onto the disc 101.

Also, the mode change/timing controller portion 137, during the write-in operation, outputs control signals to the sampling clock distributor circuit 132, the A/D converter circuits 141–144, the memory control signal distributor circuit 134 and the memories 151–154, respectively, so as to stop the operations thereof, by bringing the read-out mode signal to be into an unable condition, so that it controls the each portion not to read out the write-in signal on the disc 101 as the disc reproduction signal, erroneously. The write-in operation described in the above is mentioning about the operation condition of the testing apparatus during the test target period (the write-in) shown in the FIG. 2.

During the read-out operation as the second operation condition, upon basis of the read-out mode signal which is produced through conducting the discrimination of the read-out sector by means of the sector detection function mentioned above, for sampling the disc reproduction signals distributed by the disc reproduction signal distributor circuit 132 at the A/D converter circuits 141–144, which are provided in the number of N, the mode change/timing controller portion 137 outputs the read-out mode signal and the sampling clock to the sampling clock distributor circuit 133, so that sampling clocks CLK1, CLK2, CLK3 and CLK4 are produced in the sampling clock distributor circuit 133 and are outputted therefrom.

Also, at the same time, for writing and holding the digital values of the disc reproduction signal obtained through the sampling operation mentioned above, sequentially into the memories 151–154 by changing the memory addresses thereof, the mode change/timing controller portion 137 outputs a memory control signal composed of an address control signal and a write-enable signal, etc., and a read-out mode signal to the memory control signal distributor circuit 134 at the frequency which is equal to or less than the sampling clock, thereby conducting the timing control of the read-out operation of the disc reproduction signal data being digitized.

Also, the mode change/timing controller portion 137 stops the data production signal timing signal to the write-in data producing portion 121, so as to bring the write-in data producing portion 121 into the condition of stopping the output thereof, and also, for bringing the output terminal of the write-in amplifier 122 into a high impedance condition thereof, etc., so as to stop the output therefrom, it controls the write-in mode signal to be into an invalid condition, thereby stopping the write-in operation onto the disc during the read-out operation.

Namely, for controlling not to conduct the write-in operation and the read-out operation mentioned above, simultaneously, the mode change/timing controller portion 137 controls the write-in mode signal and the read-out mode signal, exclusively to each other, so that they are not valid at the same time. The write-in operation described in the above is mentioning about the operation condition of the testing apparatus during the test target period (the read-out) shown in the FIG. 2.

In the analysis processing operation as the third operating condition, for conducting the calculation processes of obtaining the average amplitude (TAA) and the pulse width (PW50) of the disc reproduction signal, upon basis of the digital values (hereinafter, being described by "data") held in the memories 151–154, in the data processing portion 135, the mode change/timing controller portion 137 outputs a data process timing signal indicative of whether the data written in the memories 151–154 are valid or not, to the data processing portion 135, and it also outputs an analysis process timing signal indicative of whether the result of calculation process in the data processing portion 135 is valid or not, which is used in the calculation process in the analysis processing portion 136, to the analysis processing portion 136.

For example, if the data written into the memories 151–154 are valid, the analysis process is able even during the read-out operation or the write-in operation, then the data process timing signal or the analysis process timing signal is controlled, independently from the write-in mode signal and the read-out mode signal. Namely, the analysis process operation described in the above is mentioning about the operation condition of the testing apparatus, which operates independently from and in parallel with any one of the test target periods (the write-in/read-out) shown in the FIG. 2, or a non-test target period.

Also, in the testing apparatus of the magnetic recording medium or the magnetic head shown in the FIG. 1, the central processing unit (CPU) 111 provided in the controller portion 110 controls the operations of all over the testing apparatus, in accordance with operation control program which is written into the memory 112.

Namely, in the FIG. 1, the CPU 111 conducts the oscillation frequency control onto the variable frequency oscillators 113 and 114, settings of the timing control data of the start/stop sector values, etc., and the write-in/read-out modes for the mode change/timing controller portion 137, setting of the write-in data for the write-in data producing portion 121, the holding operations of reading out the result of deciding of good or bad quality of the magnetic disc or the magnetic head as the test target, as the output of the analysis processing portion 136 or the operation condition of the each part of the testing apparatus, etc., so as to hold them into the memory 112, and a communication process with a host computer 2 which is provided outside.

Also, as shown in the FIG. 1, in the testing apparatus 1 is provided a display device 160, thereby displaying the measurement values of the disc reproduction signal obtained in the data processing portion 135 under the control of the CPU 111, the results of the calculation processes, the results of the decision processes, or the operation conditions of each portion of the testing apparatus, etc., to users of the testing apparatus.

Herein, in the testing apparatus 1 of the magnetic recording medium or the magnetic head shown in the FIG. 1, the data processing portion 135 is constructed with, for example, logic circuits, such as a DSP (Digital Signal Processor) for conducting digital signal processing, etc., and it conducts an interpolation process, etc., upon basis of the digital values of the disc reproduction signal held in the memory 151, thereby calculating out the amplitude value of each pulse for an arbitrary sector position or an arbitrary number of the disc reproduction signal pulses or the average amplitude value thereof, or the pulse width of the each pulse at an arbitrary threshold value or the average pulse width thereof, through the calculation process.

Figure 3:
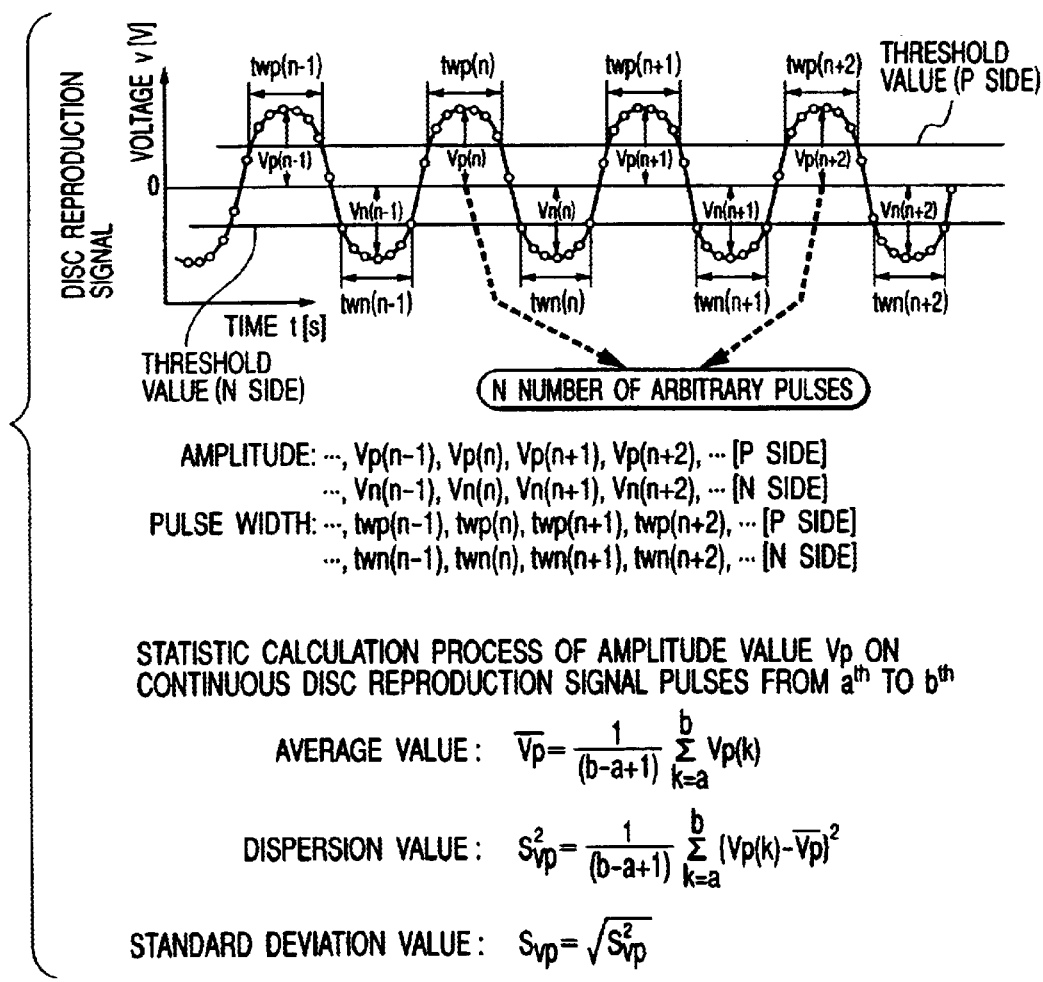
FIG. 3 is a view for explaining a statistic calculation process on a peak value and a pulse width of a disc reproducing signal.

Namely, with the testing apparatus of the magnetic recording medium or the magnetic head, according to the present invention, the disc reproduction signal is digitized and held in the memory during the arbitrary data reproduction period or a whole data reproduction period, therefore it performs statistic calculation processes for calculating out an average value, a value of dispersion, a value of deviation, and a value of cumulative frequency, etc., for the value of amplitude of the disc reproduction signal or the pulse width in the arbitrary threshold value, as shown in FIG. 3, upon basis of the digital values held therein, or performs a frequency analysis calculation process of FFT (Fast Fourier Transform), etc., onto the discrete values held therein, thereby being able to conduct a detailed test onto the magnetic recording medium or the magnetic head.

However, in the FIG. 3, there is shown the statistic calculation process on the continuous disc reproduction signal pulses from $a^{th}$ to $b^{th}$ where a<b, for explanation on the pulses of the disc reproduction signal, however the present invention should not be restricted only to this, but it is needless to say that the calculation process can be conducted upon the disc reproduction signal pulses of an arbitrary number, i.e., the discontinuous pulses, such as every $2^{nd}$ pulse of the disc reproduction signal pulses, for example.

Also, in the testing apparatus 1 of the magnetic recording medium or the magnetic head shown in the FIG. 1 mentioned above, there is described the structure of using the disc 101 as the magnetic recording medium as the test target, however it is also possible to conduct the test on the magnetic head, by conducting the recording/reproducing on to/from the disc with using the disc, which is of good qualify and is acknowledged of the magnetic characteristics thereof, and the magnetic head to be the test target.

Also, in the FIG. 2, there were explained the structure and the method of deciding the test target periods in the recording/reproducing track on the disc with using the index signal or the encoder signal from the disc rotation controller portion 104, however the testing apparatus according to the present invention should not be restricted only to this, but it is possible to make the decision of the test target period, by recording the sector discrimination signals or the test period start/stop signals for the recording/reproducing tracks of the disc 101, for example, and to conduct the test on the magnetic recording medium or the magnetic head, as well, by reproducing the sector discrimination signals or the test period start/stop signals.

Also, in the FIG. 2(2), there is explained the test by the unit of number of the disc rotation, however the testing apparatus according to the present invention should not be restricted only to this, and the test of the magnetic recording medium or the magnetic head is also possible, by measuring the rotation number of the disc 101 and the recording time onto the disc 101, so as to conduct the decision/control on the recording time, or by measuring the reproduction time, so as to conduct the decision/control on the reproduction time.

Next, conversion operation of the disc reproduction signal into the digital value, in the first embodiment according to the present invention, shown in the FIG. 1, will be explained by referring to FIG. 4.

Figure 4:
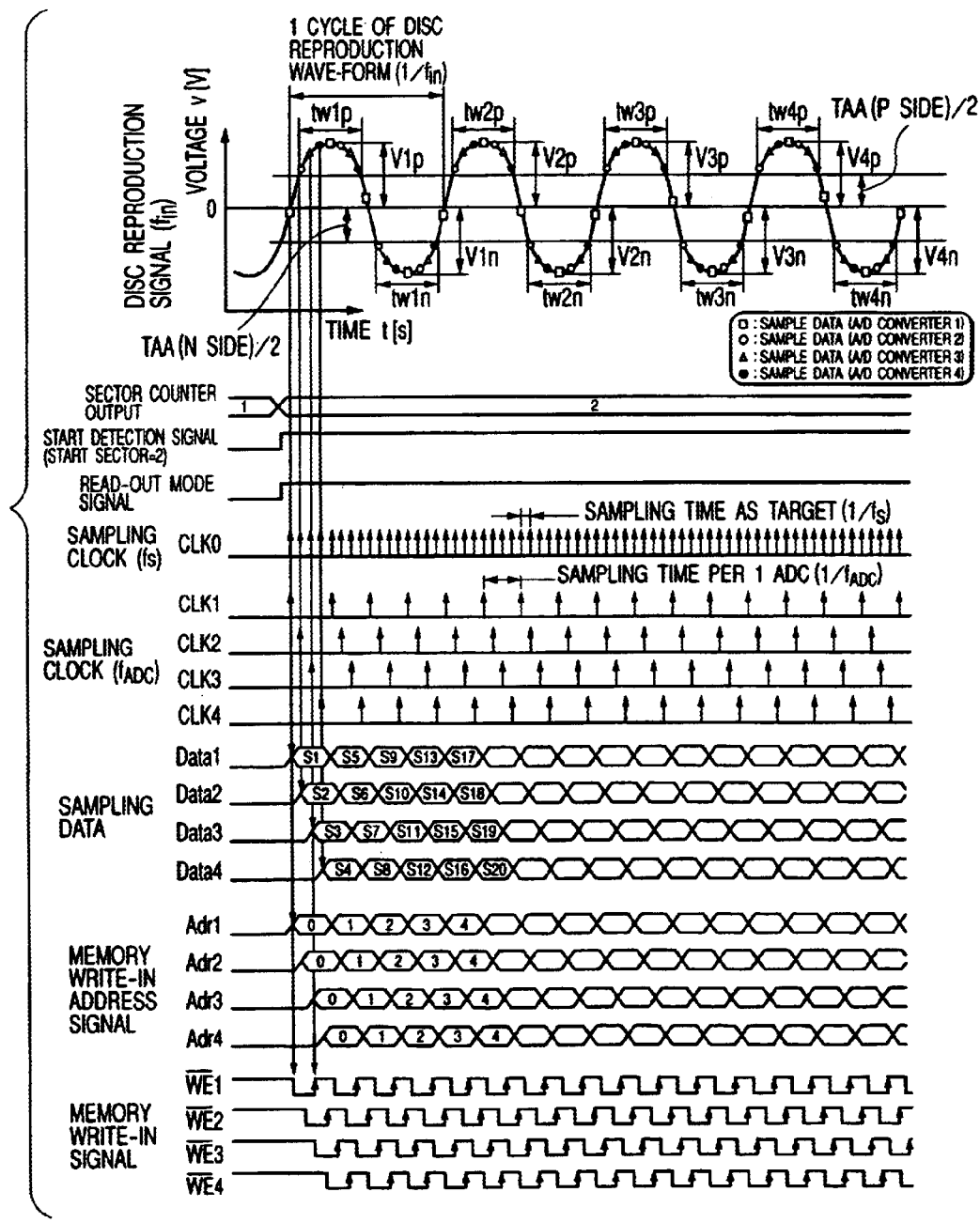
FIG. 4 is a view for explaining an operation of sampling the disc reproducing signal with using plural A/D converter circuits, so as to convert it into digital value, in connection with the first embodiment of the FIG. 1.

FIG. 4 shows an example of the conversion operation from the time when the read-out mode signal comes to be valid, in connection with the conversion operation into the digital values thereof when the A/D converter circuits and the memories are provided in the number of four (4), respectively (N=4), wherein each of the A/D converter circuits 141–144 conducts the sampling operation at the frequency $f_{ADC}$, and the conversion operation into the digital value, while each of the memories 151–154 conducts the holding operation of the digital value data at the frequency equal to that of the $f_{ADC}$, respectively.

Figure 5:
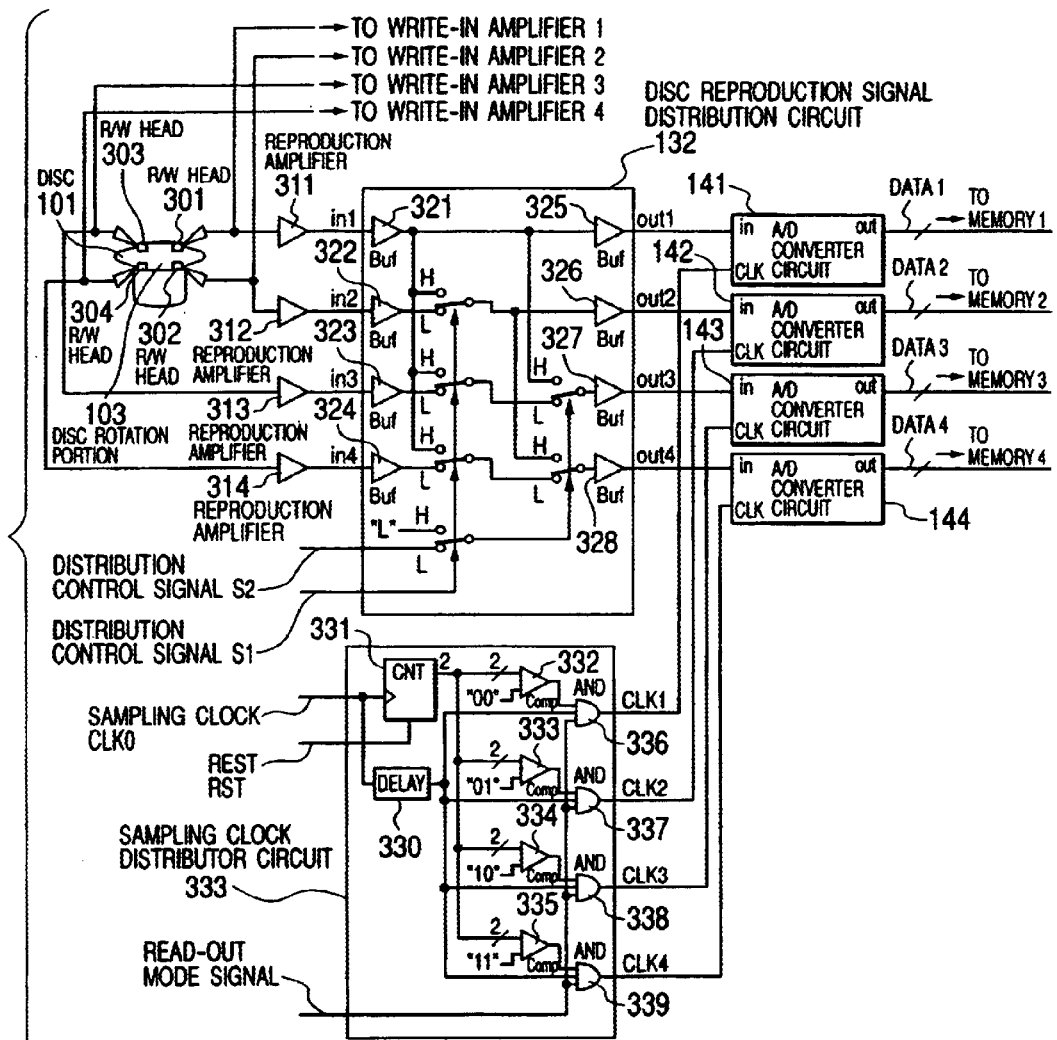
FIG. 5 is a view of showing a second embodiment of a testing apparatus for a magnetic recording medium or a magnetic head, according to the present invention.

The sampling clock, at which the operation control is conducted on each of the A/D converter circuits 141–144, is a sampling frequency $f_s$ as the target for the frequency to the disc reproduction signal, and in an example shown in FIG. 5, by conducting the frequency dividing control, i.e., the sampling clock CLK0, having the frequency of four (4) times (N=4) as large as the sampling frequency $f_{ADC}$ of each of the A/D converter circuits 141–144, is produced during the period when the read-out mode signal is valid in the mode change/timing controller portion 137, and the sampling clock CLK0 is divided into 4 in the frequency thereof within the sampling clock distributor circuit 133, so that the CLK0 outputs one pulse per four (4) pulses to one of the A/D converter circuits 141–144, thereby distributing it into CLKs 1–4 to be inputted to the A/D converter circuits 141–144, respectively.

Also, the memory control signal outputs the address control signal so as to increase the memory address, sequentially at the frequency $f_{ADC}$, from the time when the read-out mode signal comes to valid, to each of the memories 151–154 connected with the respective A/D converters 141–144, and also outputs the write enable signal at the frequency and in the phase, being same to those of the address control signal mentioned above, thereby the digital value obtained through the conversion by the A/D converter circuits 141–144 is controlled to be written into, at the memory address which is controlled by the address control signal.

Herein, in the sampling clock distributor circuit 133, each of the A/D converter circuits 141–144 is controlled to operate in parallel with the disc reproduction signal, by setting the phase differences among the sampling clocks of CLKs 1–4, for example a reciprocal number of the $f_{ADC}$, i.e., 1/N of the sampling time per one (1) circuit of the A/D converter circuits, thereby each of the A/D converter circuits 141–144 converts the disc reproduction signal into the digital values in time sharing, and outputs it in order of the time sharing, i.e., S1→S2→S3→S4→S5→S6→ . . . of the sampling data Data 1–4.

Namely, it realizes the high speed sampling at the N time as large as $f_{ADC}$ and the conversion into digital value for the disc reproduction signal. Also, in the explanation in the above, there is described that the disc reproduction signal is distributed without giving the phase difference thereto and the sampling clocks are distributed with giving the phase difference, there by realizing the high speed sampling, on the contrary to this, by distributing the sampling clock without giving the phase difference in the sampling clock distributor circuit 133, and distributing the disc reproduction signal with giving the phase difference in the disc reproduction signal distributor circuit 132, so as to conduct the sampling, however it is needless to say that the high speed sampling can also be realized in the same manner.

In the FIGS. 1 and 4, there are explained the cases where N=4, however a relationship of the following Equation 1 is established among the number N in the parallel provision of the A/D converter circuits, a frequency $f_{in}$ of the disc reproduction signal, the sampling frequency $f_{ADC}$ per one circuit of the A/D converter circuits, a ratio M of the sampling frequency $f_s$ as the target with respect to $f_{in}$ (M=16 in the FIG. 4). However, where as the $f_{in}$ is used either a $N^{th}$ high frequency component $f_{ina}$ of the disc reproduction signal frequency, for measuring the pulse portion as the target for the disc reproduction signal, or a repetition frequency component $f_{inb}$ of the disc reproduction signal pulses. In the wave-form of the disc reproduction signal shown in the FIG. 4 is used a sinusoidal wave for the explanation thereof, and the sinusoidal wave, as is known in general, does not have the Nth high frequency component but is same to the repetitive frequency in the basic frequency component thereof, therefore it is the case where $f_{ina}$ and $f_{inb}$ are coincident with.

$$N \geq M \times f_{in}/f_{ADC} \quad \text{(Equation 1)}$$

However, in the Equation 1, where N is an integer being equal to or greater than one (1). The frequency $f_{in}$ of the disc reproduction signal is controlled through varying the oscillation frequencies of the variable frequency oscillator circuits 113 and 114 mentioned above, by means of the CPU 111 provided in the controller portion 110, i.e., it is determined by means of the recording frequency of the write-in data and the disc rotation number and data patterns when writing/reproducing.

Also, the ratio between the $f_{in}$ and the target sampling frequency is to be defined with using the accuracy of measurement, etc., with respect to the characteristics of the magnetic recording medium or the magnetic head as the test target, and the sampling frequency $f_{ADC}$ per one circuit of the A/D converter circuits is the frequency of the sampling clock which is produced within the mode change/timing controller portion 137 and is distributed to, with the maximum sampling frequency as an upper limit thereof.

Accordingly, the $f_{in}$, $f_{ADC}$ and M mentioned above, in the testing apparatus 1 of the magnetic recording medium or the magnetic disc shown in the FIG. 1, are values which are known previously, and are able to be set to values, at which the user of the testing apparatus intends.

Accordingly, conducting the sampling on the disc reproduction signal in details in a direction of a time axis with the structure mentioned above, thereby it is possible to convert an abrupt or sharp change of the disc reproduction signal, for example, into the digital value at high accuracy, and by using the data of digital value at high accuracy when calculating out the TAA or the PW50, etc., through the digital calculation process, for example, it is possible to perform the test of the magnetic disc or the magnetic head at high accuracy.

Namely, according to the present invention, in the testing apparatus of the magnetic recording medium or the magnetic head, the test data reproduced is converted into the digital values, and from the digital values converted is treated the calculation process in relation to the magnetic characteristics of the magnetic recording medium, so as to conduct the test of the magnetic recording medium, thereby it is possible to realize the testing in details and at high accuracy on the magnetic recording medium or the magnetic head.

Also, according to the present invention, in the testing apparatus of the magnetic recording medium or the magnetic head, there are provided N number (N is an integer) of converter means for converting the reproduced test data into the digital values, a sampling clock controller means for operating the N number of the converter means at a predetermined sampling frequency for each one thereof, N number of holding means for holding the digital values which are converted by the N number of the converter means, and a data processing means for conducting calculation processes in relation to the magnetic characteristics of the magnetic recording medium, wherein the testing is conducted on the magnetic recording medium, thereby it is able to realize the testing in details and at high accuracy on the magnetic recording medium or the magnetic head.

Also, according to the present invention, in the testing apparatus of the magnetic recording medium or the magnetic head, as is in the one embodiment mentioned above, there are provided N number of the converter means, the sampling clock reproducing means, N number of the holding means, the data processing means and the analysis processing means, thereby it is able to realize the testing at high speed on the magnetic recording medium or the magnetic head. Accordingly, it is possible to perform the testing on the magnetic disc or the magnetic head at high accuracy, corresponding to the tendency of being high frequency on the disc reproduction signal in future.

Next, explanation will be given on a second embodiment according to the present invention, by referring to FIG. 5. In FIG. 5, L number of R/W heads and reproduction amplifiers corresponding thereto are provided for the disc, i.e., the magnetic recording medium as the test target, wherein, for example, the disc reproduction signals on the different tracks or sectors are detected by the respective R/W heads, so as to obtain L number of the reproduction signals through amplifying them by means of the reproduction amplifiers, and they are outputted, by changing the number of distribution number and destinations in distribution of the disc reproduction signals, through controlling change-over switches SW by means of the distribution control signal in the disc reproduction signal distributor circuit, to the plurality number of the A/D converter circuits provided in the number N, thereby being converted into the digital value at the sampling frequency $f_{ADC}$ in each of the A/D converter circuits to be outputted into the memory.

In the FIG. 5 is shown an example of the structure, in which the outputs of four (4) number of the R/W head 301–304 and the reproduction amplifiers 311–314 are inputted into the disc reproduction signal distributor circuit 132, and the distribution control signals S1 and S2 are exchanged, so as to change the connecting condition between the inputs and outputs of the disc reproduction signal distributor circuit 132, thereby controlling the number in the distribution of disc reproduction signal to be variable to the A/D converter circuits 141–144, which are provided in the number of four (4) (N=4).

Also, the sampling clock distributor circuit 133 is constructed, so that it operates the counter 331 with using the sampling clock which is outputted by the mode change/timing controller portion 137 in the FIG. 1, and it outputs the sampling pulse only when the output of the counter 331 and the N number of setting values are coincident with, in the comparator circuits 332–335 provided in the number N, during the read-out mode, and it has the construction to divide the sampling clock into N times in the frequency thereof and to convert them into a clock of N phases, where the phase difference between the respective sampling pulses is equal to the time, being obtained through dividing the period of sampling clock, which is divided by N in the frequency, and the sampling clock having N times as large as the frequency of sampling frequency $f_{ADC}$ as an operating frequency of one A/D converter circuit is produced by the mode change/timing controller portion 137, thereby supplying the sampling clock to each of the A/D converter circuits at the sampling frequency of $f_{ADC}$ and with the phase difference of N phases.

Herein is described the structure, in which the counter 331 and the comparators 332–335 are used as the sampling clock distributor circuit 133, however the structure should not be restricted only to this, and it may be constructed with using delay elements, for example, to distribute the sampling clock into N with the phase difference of N phases.

In the FIG. 5, there is shown the structure, in which the sampling clock at the frequency of four (4) times as large as $f_{ADC}$ is inputted into the sampling clock distributor circuit 133, so as to operate the counter 331, thereby to compare four (4) of the output conditions of the counter 331, i.e., 00, 01, 10 and 11 and the setting values by the comparator circuits 332–335, and the sampling clock CLK0 which is delayed in a delay circuit 330 is gated by AND gates 336–339 upon basis of an incident output of each of the comparator circuits 332–335, thereby outputting the outputs of the AND gates 336–339, as the sampling clocks CLKs 1–4, to the A/D converter circuits 141–144, respectively.

However, the output of each of the A/D converter circuits 141–144 is supplied to the memories 151–154 being same as those shown in the FIG. 1, and the outputs thereof are connected to the data processing portion 135 and the analysis processing portion 136.

Figure 6:
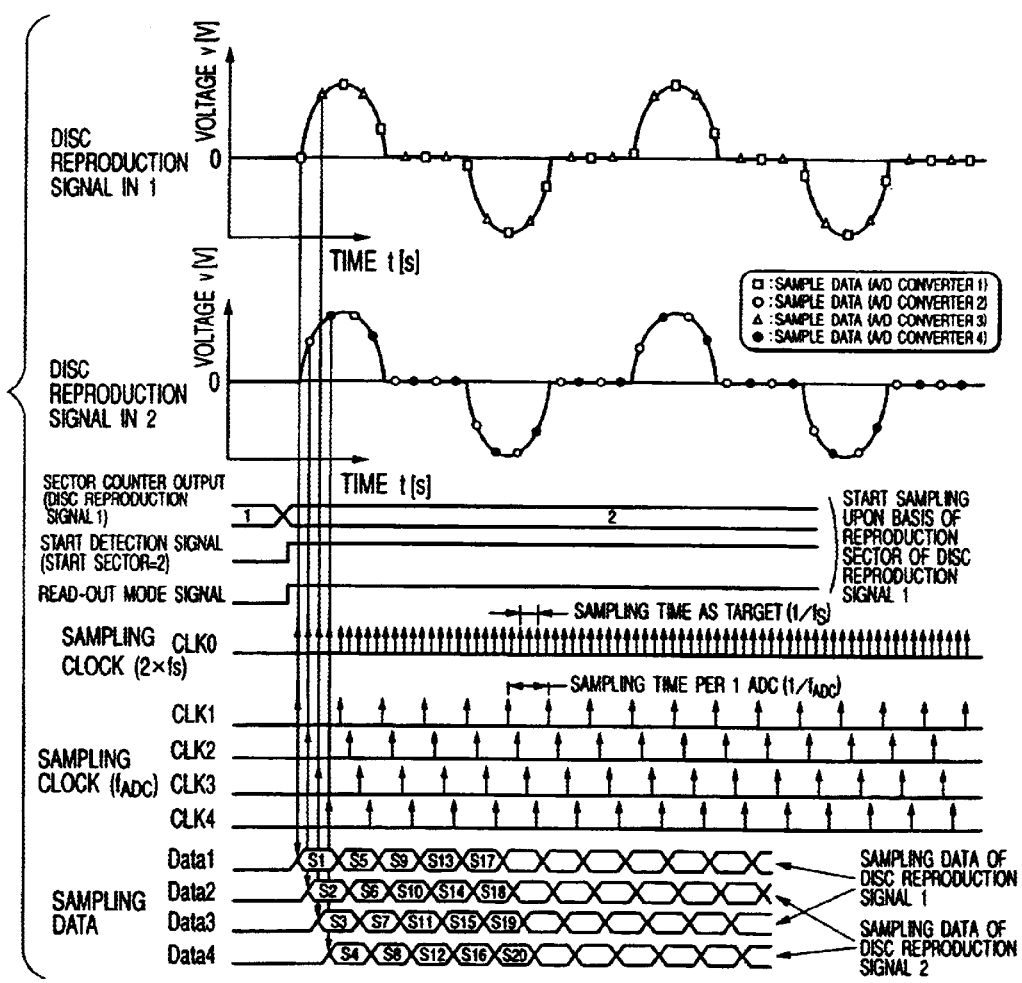
FIG. 6 is a view for explaining an operation of sampling the disc reproducing signal with using plural A/D converter circuits, so as to convert it into digital value, in connection with the second embodiment of the FIG. 2.

FIG. 6 is, in connection with the second embodiment according to the present invention, for explanation of an operation of the sampling circuit in the mode change/timing controller portion 137 shown in the FIG. 1 (not shown in the figure in the FIG. 5), when it starts the sampling operation by discriminating the start sector and bringing the read-out mode signal to be valid, and it shows the case where the distribution control signals shown in the FIG. 5 are S1='L' and S2='L'.

Herein is shown an example, where the disc reproduction signal in1 is an output signal from the R/W head 101 and the reproduction amplifier 311, and it is distributed into the A/D converter circuits 141 and 143 to be inputted therein, while the disc reproduction signal in2 is an output signal from the R/W head 302 and the reproduction amplifier 312, and it is distributed into the A/D converter circuits 142 and 144 to be inputted therein, namely, it is an example where the disc reproduction signals which are outputted in the disc reproduction signal distributor circuit 132 are two (2) kinds (L=2). Also, there is shown an example where the sampling operation is started by determining that the reproduction sector number of the disc reproduction signal in1 is two (2) for two disc reproduction signals in1 and in2.

Namely, the sampling operation on each of the disc reproduction signals comprises, as shown in the FIG. 6, sampling the reproduction signal distributed in to the A/D converter circuits 141 and 143 at the timings of the sampling clocks CLK1 and CLK3, respectively, thereby to convert them into the sampling data Data1 and Data3, and sampling the reproduction signal distributed into the A/D converter circuits 142 and 144 at the timings of the sampling clocks CLK2 and CLK4, respectively, thereby to convert them into the sampling data Data2 and Data4.

Accordingly, at the end, the disc reproduction signal in1 is written into the memories 151 and 153 (not shown in the figure), as the sampling data in the order S1→S3→S5→S7→ . . . , while the disc reproduction signal in2 is written into the memories 152 and 154 (not shown in the figure), as the sampling data in the order S2→S4→S6→S8→ . . .

Further, herein for explanation, only the reproduction sector number of the disc reproduction signal in1 is used to decide or discriminate the start of the sampling operation for two disc reproduction signals in1 and in2, however in actual, the decision or discrimination is made on each of the sector numbers, separately, for example, for each of the disc reproduction signals, thereby it is also possible to conduct the testing, respectively, for an arbitrary preset track or sector interval, independently.

Also, in case where the distribution control signals are set to be, i.e., S1="L" and S2="L" in the disc reproduction signal distributor circuit 132 shown in the FIG. 5, this means that the disc reproduction signals in1–in4 are distributed into the A/D converter circuits 141–144, which are provided in number of four (4) (N=4), at 1:1 for each (L=4), thereby sampling the disc reproduction signal in1–in4 at the frequency $f_{ADC}$.

Also, in case where the distribution control signal is set to be, i.e., S1="H" in the disc reproduction signal distributor circuit 132 shown in the FIG. 5, this means that only the disc reproduction signal in1 is distributed into the A/D converter circuits 141–144, which are provided in number of four (4) (N=4), and in this case, the circuit operation of the testing apparatus is equal to that of the circuit shown in the FIG. 2, i.e., being equal to sampling the disc reproduction signal in1 at the four (4) times as large as frequency of $f_{ADC}$, therefore conducting the conversion in the order S1→S3→S5→ . . . on the disc reproduction signal in1.

Herein, turning attention to the sampling frequency $f_{sample}$ for one disc reproduction signal while setting the sampling frequency of each of the A/D converter circuits 141–144 at $f_{ADC}$, the $f_{sample}$ is equal to $(N/L) \times f_{ADC}$, then it is possible to variably control the sampling frequency by changing the distribution control signal for the disc reproduction signal.

Namely, as was mentioned in the above, in the testing apparatus of the magnetic recording medium or the magnetic head, since the frequency $f_{in}$ of the disc reproduction signal is controllable and has the known value, it is possible to control the sampling frequency $f_{sample}$ for the one disc production signal with a relationship of the following Equation 2, by controlling the connection condition with L number of disc reduction signals in the disc reduction signal distributor circuit, for the parallel number N of the A/D converter circuits, that is determined by using the relationship indicated in the Equation 1.

$$f_{sample} = (N/L) \times f_{ADC} \quad \text{(Equation 2)}$$

Accordingly, for example in a case where the frequency component as an measurement target for the disc reproduction signal is high with respect to the sampling frequency of the A/D converter circuits, by using one R/W head and one reproduction amplifier and N number of A/D converter circuits, i.e., in the relationship shown by the Equation 2, in the testing apparatus of the magnetic recording medium or the magnetic head realizing the high speed sampling operation, while in a case where the frequency component of the disc reproduction signal as the measurement target when using the disc or the magnetic head as the measurement object is not high with respect to the sampling frequency of the A/D converter circuit or where there is a margin in measurement accuracy, by using L number of R/W heads and reproduction amplifiers and N number of the A/D converter circuits, i.e., L>1 (L=2 in the FIG. 5) in the relationship shown by the Equation 2, it is possible to measure the different tracks on the disc, at the same time, with using the plural number of heads of L, therefore it is possible to improve throughput in testing processes of the disc or the magnetic head.

Also, with the testing apparatus according to the present invention, the number of the discs to be tested should not be restricted, and for example, by using the a plural number of magnetic heads for a plural pieces of discs and the reproduction amplifiers corresponding to the magnetic heads, it is possible to make the measurement on the plural pieces of the discs or the plural number of the magnetic heads, at the same time, and also the apparatus may be constructed to have a transmission apparatus of the discs for obtaining an improvement in the throughput of the disc test.

Herein, in the FIGS. 5 and 6, for the explanation on the second embodiment according to the present embodiment, there is no description about the variable frequency oscillator circuit, nor the function of writing the test data, nor the holding function of the digital value data which are obtained by digitizing the disc reproduction wave-form, nor the calculation process function of calculating out a desired measurement value from that digital value data, nor the timing control function, however those functions are same to those shown in the first embodiment according to the present embodiment in the FIG. 1, therefore the testing apparatus of the magnetic recording medium or the magnetic head according to the present invention has also those functions.

Also, in the FIGS. 5 and 6, it has the construction so that the sampling clock is supplied with being fixed in the phase for each of the A/D converter circuits, for the purpose of explanation thereof, however the present invention should not be restricted only to this, and for example, it may be possible to be constructed, so that the phase difference of the sampling clocks distributed in the sampling clock distributor circuit 133 is changed over, depending upon the distribution control signal to the disc reproduction signal distributor circuit 132, then it is sufficient that it can realize the sampling at the sampling frequency which is indicated by the Equation 2, for each of the L number of disc reproduction signals. Also, it may be constructed so that it variably controls the sampling frequency depending upon the control of distribution control signal, namely, the parallel number of the A/D converter circuits for the one reproduction signal.

Namely, according to the present embodiment, the testing apparatus of the magnetic recording medium or the magnetic head has the construction, so that the L number of the disc reproduction signals outputted from the R/W heads and the reproduction amplifiers, which are provided of number L, are distributed to the A/D converter circuits provided in the number L, by using the reproduction signal distributor circuit, so as to process the plural number of the reproduction signals by converting them into the digital values thereof, in parallel and separately, thereby realizing the high speed of testing on the magnetic recording medium or the magnetic head.

Next, explanation will be given on a third embodiment according to the present invention. In the testing apparatus of the magnetic recording medium or the magnetic head, as was mentioned in the above, the testing of the magnetic recording medium or the magnetic head is conducted by measuring the average amplitude TAA and the average pulse width PW50 for the disc reproduction signal. The average amplitude TAA and the average pulse width PW50 are obtained by measuring the amplitude and the pulse width of the disc reproduction wave-form and treating averaging process thereon for one turn or revolution of the disc, for example, as is shown in FIG. 11.

Herein, in case of sampling the disc reproduction wave-form at a constant time distance, in particular in a portion where voltage changing rate of the disc reproduction wave-form with respect to the time, i.e., the inclination thereof is large, the sampling density comes to be low in relation with the direction of amplitude, while the sampling density comes to be high in relation with the direction of amplitude, in particular in a portion where the inclination of the disc reproduction wave-form is small.

Figure 8:
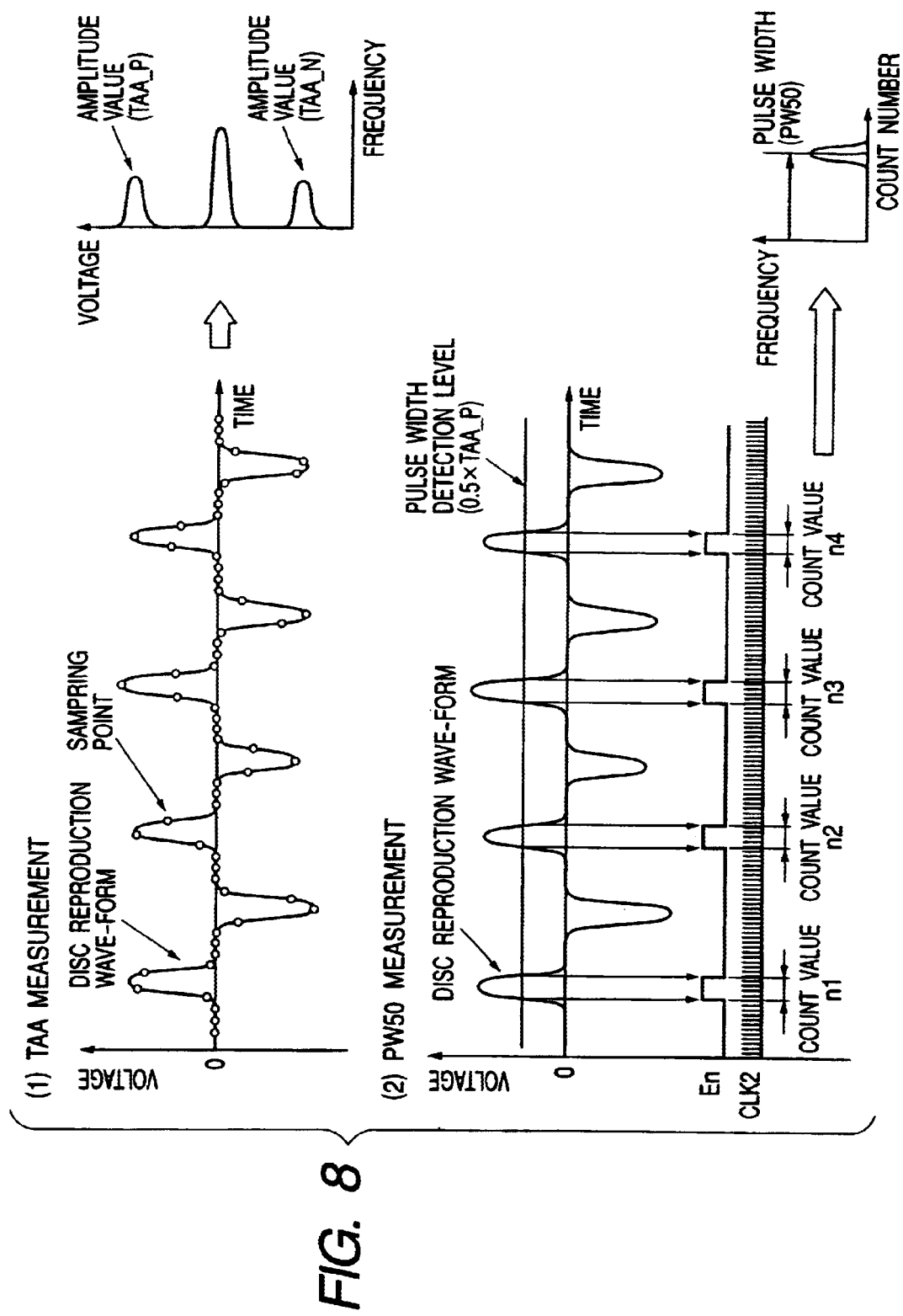
FIG. 8 is a view of explaining principle of measuring a value of an average amplitude TAA and an average pulse width PW50 on the disc reproducing wave-form, in connection with the third embodiment of the FIG. 7.

For example, with the disc reproduction signal shown in FIG. 8(1), incidence frequency of the sample values comes to be high in the vicinity of 0 [V] and the peak value. In this instance, the sample value having the highest frequency in the peak value of the disc reproduction signal is almost equal to the average amplitude TAA of the disc reproduction signal shown in the FIG. 11. Accordingly, by measuring the incidence frequency of the disc reproduction sample values, so as to discriminate the sample value to be the peak value in the incidence frequency thereof, the measurement of the TAA comes to be possible.

Also, as is shown in FIG. 8(2), the pulse number of the pulses for use in counting is measured during the time period when the amplitude of the disc reproduction signal is greater than the threshold voltage, for each of the disc reproduction pulses, and on that pulse number, the incidence frequency of each of the pulse numbers is measured, in the same manner of the measurement of TAA mentioned above, thereby detecting the pulse number to be highest in the incidence frequency thereof. Herein, as the threshold voltage is used the value of 50% of the TAA value mentioned above. The time of pulse width, which is obtained by conducting multiplication process of the pulse number onto the reciprocal of the oscillation frequency of the pulse for use in counting of the time, comes to be almost equal to the value of the average pulse width PW50 of the disc reproduction signal shown in the FIG. 11. Accordingly, by measuring the pulse width of the disc reproduction signal for each of the disc reproduction signal pulses, so at to discriminate the pulse width to be at the peak value in the incidence frequency of the pulse width, the measurement of PW50 comes to be possible.

Figure 7:
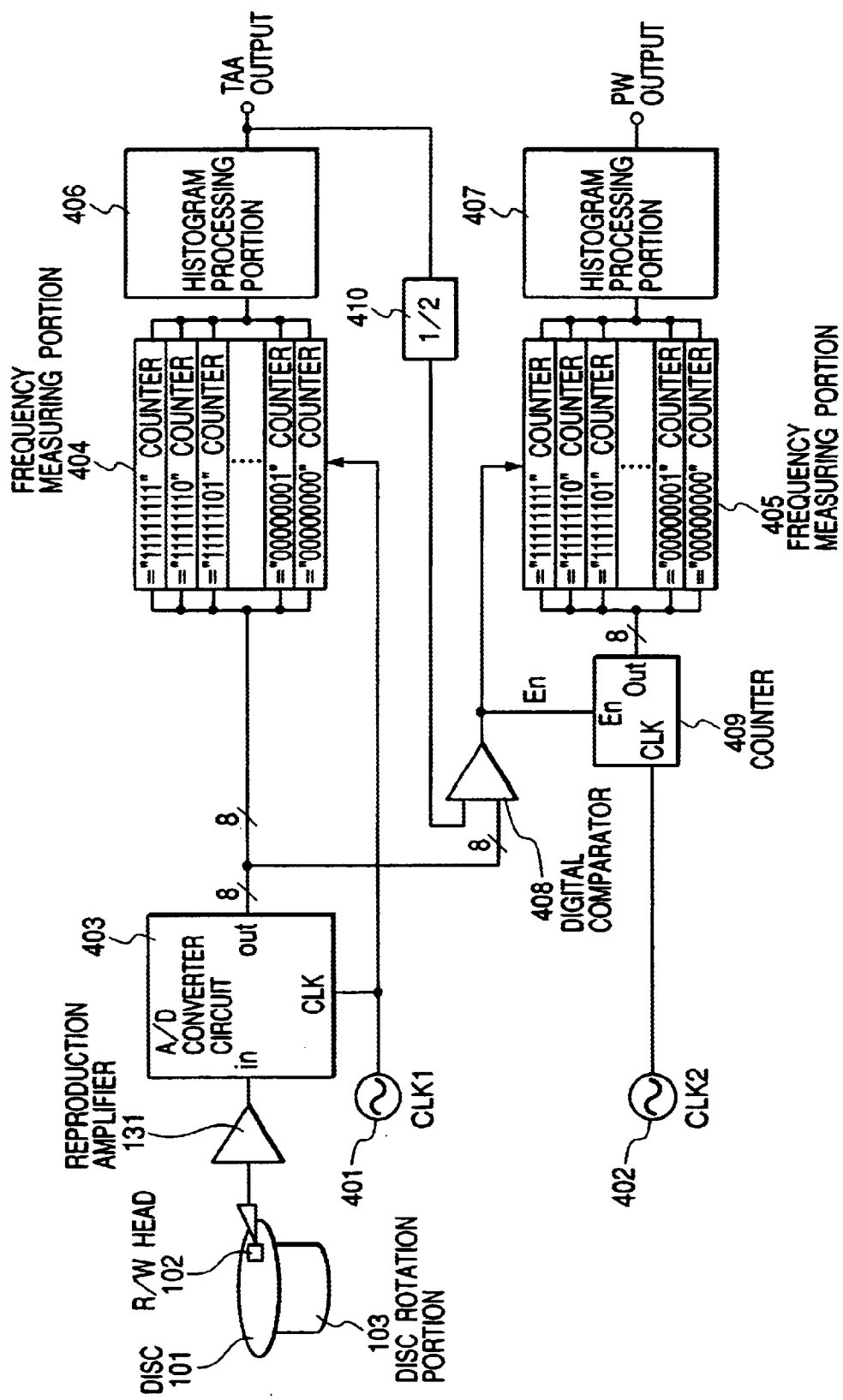
FIG. 7 is a view of showing a third embodiment of a testing apparatus for a magnetic recording medium or a magnetic head, according to the present invention.

FIG. 7 is a view of showing the structure of an apparatus, in the testing apparatus of the magnetic recording medium or the magnetic head, according to the present invention, for measuring the average amplitude TAA and the average pulse width PW50 of the disc reproduction signal upon basis of the measuring method mentioned above, when reproducing the test data written into the magnetic disc for conducting the testing on the magnetic disc or the magnetic head.

Namely, in the testing apparatus of the magnetic recording medium or the magnetic head shown in the FIG. 7, the reproduction of the wave-form of the test data is conducted through the R/W head 102 and the reproduction amplifier 131, from the magnetic disc which is operated to rotate by the disc rotation portion 103 and is written with the test data, and this is sampled according to the sampling clock CLK1 in the A/D converter circuit 403, thereby to convert it into the digital value.

A frequency measurement portion 404, in which are provided, for example, frequency counters for each of the digital values outputted by the A/D converter circuit 403, operates the frequency counters to make an increment operation on the count values of the frequency counters corresponding to the digital value which the A/D converter circuit 403 outputs, upon basis of the frequency count clock having the frequency same to that of the sampling clock CLK1. A histogram processing portion 406 is constructed with gate circuits, and it reads out the outputs of the plural frequency counters which are provided in the frequency measurement portion 404, one by one, for example, at the same time when the read-out operation is completed for the each one turn or revolution of the disc 101, thereby outputting the peak value in the vicinity of the amplitude of the disc reproduction wave-form as the measurement value of the TAA.

Also, in the testing apparatus of the magnetic recording medium or the magnetic head shown in the FIG. 7, the output value of the A/D converter circuit 403 and the threshold data which is outputted by the histogram processing portion 404 at the value of 50% of TAA, are compared in a digital comparator 408, thereby producing a counter enable signal En of the pulse number being same to that of the disc reproduction pulse number. A counter 409 operates conduct the counting operation by the clock CLK2 having the known frequency for time measuring, which is produced in the oscillator circuit 402, as well as the counter enable signal En, and then it measures the pulse number of the CLK2 during the period when the En is valid for each of the En pulses.

A frequency measuring portion 405, in which are provided, for example, frequency counters for each of the dispersion values outputted by the counter 409, operates to make the increment operation on the count value of the frequency counter, corresponding to the dispersion value which is outputted by the counter 409, by making the counter enable signal En as the frequency count clock. A histogram processing portion 407 is constructed with gate circuits, and it reads out the outputs of the plural frequency counters, which are provided in the frequency measurement portion 405, one by one, for example, at the same time when the read-out operation is completed for the each one turn or revolution of the disc 101, thereby outputting the count value corresponding to the frequency counter, at which the output value thereof is at the maximum, as the measurement value of the PW.

Herein, the measurement value of PW is given by the pulse number of the clock CLK2 for use of time measuring, however since the oscillation frequency of the clock CLK2 for use of time measuring is already known, the PW value is obtained by conducting the multiplication process of the pulse number onto a reciprocal number of the oscillation frequency of the clock CLK2 for use of time measuring, by means of the CPU (not shown in the figure) provided in the controller portion.

Figure 9:
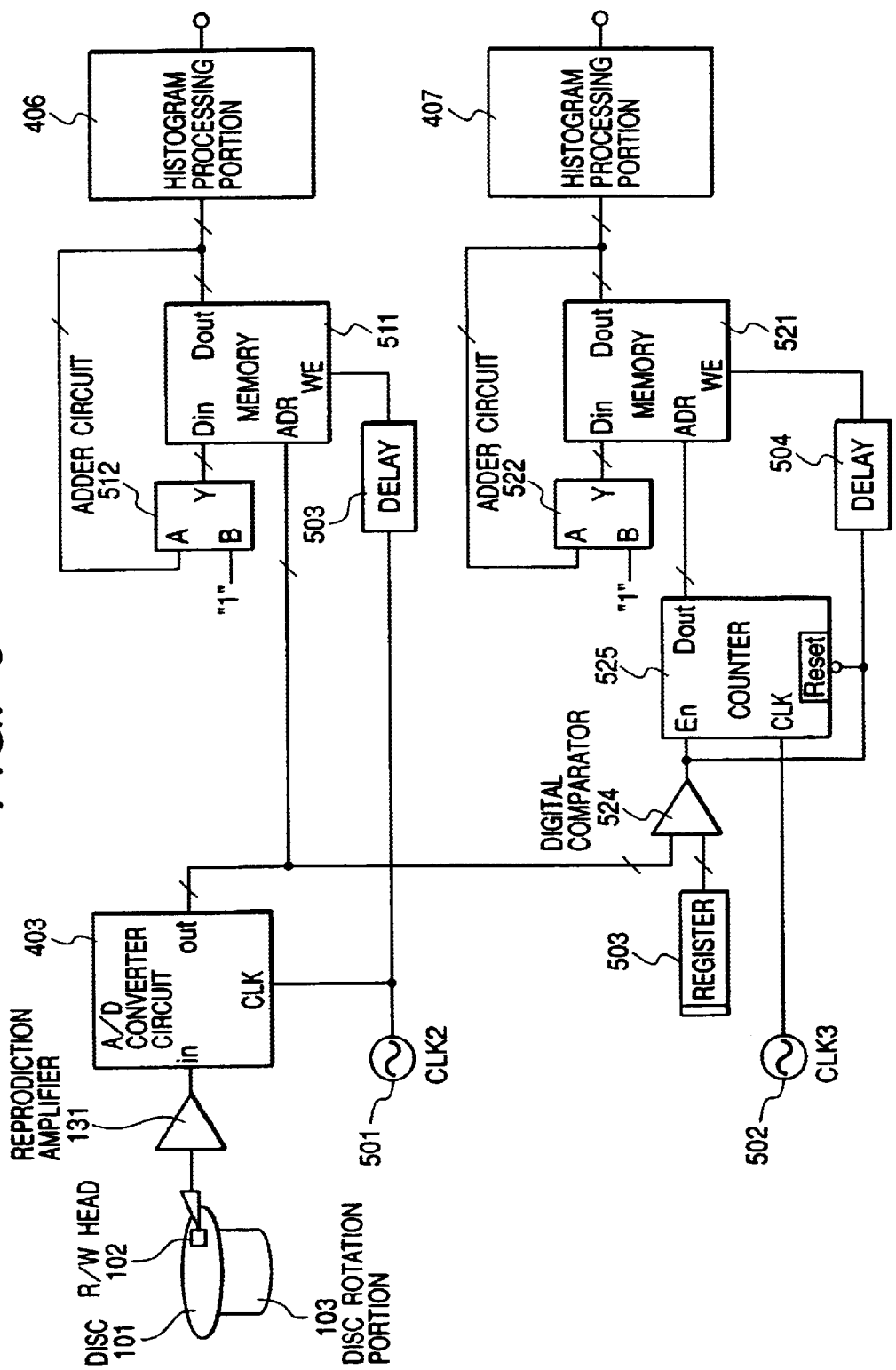
FIG. 9 is a view of showing another embodiment in connection with the third embodiment of the FIG. 7.
Figure 10:
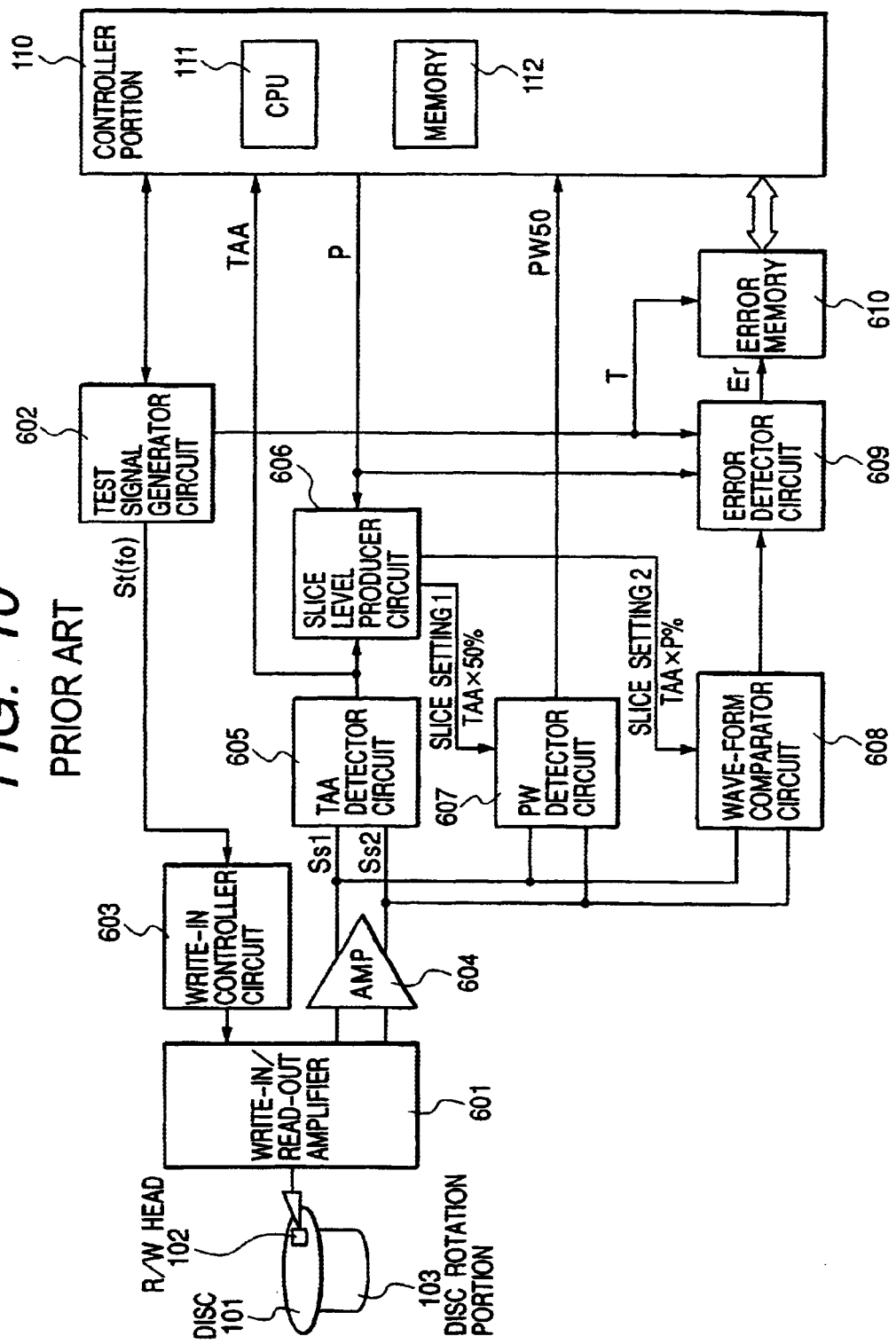
FIG. 10 is a view of showing the structure of testing apparatus for the magnetic recording medium or the magnetic head, according to the conventional art.

In the explanation mentioned above is mentioned the structure of using the plural number of the counters in the frequency measuring portions 404 and 405, however the present invention should not be restricted only to this, and it may be constructed with using memories 511 and 512 and adder circuits 512 and 522, as shown in FIG. 9, for example.

Namely, in the measurement of TAA, upon basis of the dispersion value of the disc reproduction signal which is converted by the A/D converter circuit 403, by adding the data which are written into the addresses of the memory 511 corresponding to the digital values with using the memory 511, with using the adder circuit 512, so as to write them into the same addresses, it is also possible to measure the frequency. With the measurement of the PW50, by adding the data, which are written into the addresses of the memory 521 corresponding to the output values of the counter 525 with using the memory 521, so as to write them into the same addresses, it is also possible to measure the frequency.

Also, in the FIG. 9 is shown an example of the structure, wherein the outputs of the register 523 holding an arbitrary threshold data and the A/D converter circuit 403 are compared with by using the digital comparator 524, so as to conduct the control on operation of the counter 525, namely, according to the present structure, it is possible to measure the average pulse width for the arbitrary threshold value, and also it is needless to say that it is sufficient to set the data of 50% of the measurement value of the TAA mentioned above when measuring the PW50.

Also, not shown in the figure in particular, it is also possible to measure the PW50 by measuring a total of the pulse widths of the counter enable signal En and the counter number, and by conducting averaging process thereon, i.e., by dividing the total value of the pulse widths by the pulse number after completion of the read-out thereof.

Also, in the FIGS. 7, 8 and 9, for explanation on the third embodiment according to the present invention, there is no description about the write-in function of the test data and the timing control function, etc., however those functions are also same to those in the first embodiment shown in the FIG. 1, according to the present invention, therefore the testing apparatus of the magnetic recording medium or the magnetic head has also those functions therein.

Namely, with the present invention, in the testing apparatus of the magnetic recording medium or the magnetic head for measuring the average amplitude TAA of the disc reproduction wave-from or the average pulse width PW at an arbitrary threshold level, it is characterized that both the TAA and PW or either one of them are/is measured by obtaining the frequency of the measurement values, so as to treat it/them statistically.

According to the present invention, in the testing apparatus of the magnetic recording medium or of the magnetic head, the test data reproduced from the magnetic recording medium is converted into the digital value thereof, and the calculation process is carried out in relation to the magnetic characteristics of the magnetic recording medium from the digital value converted, thereby achieving an effect of realizing the testing with details and at high accuracy on the magnetic disc or on the magnetic head.

Also, according to the present invention, the test data reproduced from the magnetic recording medium is converted into the digital value at high speed with using N number of the converter means, and the calculation process is conducted in relation to the magnetic characteristics of the magnetic recording medium from the digital value converted, thereby realizing the testing with details and at high accuracy on the magnetic disc or on the magnetic head, and it is also possible to achieves an effect of achieving the testing in conformity with the tendency of coming to high frequency in the magnetic disc apparatuses, in future.

Also, according to the present invention, in the testing apparatus of the magnetic recording medium or of the magnetic head, the plurality of the reproduction test data are converted into the digital values thereof, separately, thereby achieving an effect that the testing at high speed can be realized on the magnetic recording medium or on the magnetic head.

Also, according to the present invention, in the testing apparatus of the magnetic recording medium or of the magnetic head, there is achieved an effect that the average amplitude TAA of the reproduction test data and the average pulse width PW50 can be measured at high speed.

What is claimed is:

1. A testing apparatus of a magnetic recording medium for conducting a test on the magnetic recording medium through recording testing data onto the magnetic recording medium by means of a magnetic head, reproducing the recorded testing data by means of the magnetic head, and performing a predetermined process on the reproduced testing data, wherein:

the reproduced testing data is converted into digital data by using a plurality of analog-to-digital converters each provided with a predetermined sampling clock for sampling the reproduced testing data; and a calculation process is performed on the converted digital data in relation to a magnetic characteristic of the magnetic recording medium, thereby conducting the test on the magnetic recording medium, the calculating process calculating at least an amplitude value of each pulse or an average amplitude thereof, which is obtained through reproduction from the magnetic recording medium, or a pulse width at an arbitrary threshold value or an average pulse width thereof.

2. A testing apparatus of a magnetic recording medium according to claim 1, wherein the calculation process is a statistic calculation process or a frequency analysis calculation process, in which a peak value of the reproduced testing data or a threshold value time when exceeding or being below an arbitrary threshold value is measured using the converted digital data, thereby to calculate an average value or a dispersion value or a deviation value or a cumulative frequency with respect to the peak value or the threshold value time.

3. A testing apparatus of a magnetic recording medium according to claim 1, further comprising:

holding means for holding the digital data converted by the plurality of analog-to-digital converters; and data processing means for performing the calculation process on the digital data held in the holding means in relation to the magnetic characteristic of the magnetic recording medium, thereby conducting the test on the magnetic recording medium.

4. A testing apparatus of a magnetic recording medium for conducting a test on the magnetic recording medium by using reproduced data obtained through reproduction of the magnetic recording medium, comprising:

a plurality of conversion means for converting the reproduced data into digital data, each conversion means provided with a predetermined sampling clock for sampling the reproduced data;

holding means for holding the digital data converted by the plurality of conversion means;

data processing means for performing a calculation process on the digital data held in the holding means in relation to a magnetic characteristic of the magnetic recording medium, the calculating process calculating at least an amplitude value of each pulse or an average amplitude thereof, which is obtained through reproduction from the magnetic recording medium, or a pulse width at an arbitrary threshold value or an average pulse width thereof, by using the digital data held in the holding means; and analysis processing means for performing an analysis to determine whether information obtained by the data processing means satisfies a certain condition.

5. A testing apparatus of a magnetic recording medium according to claim 4, wherein the calculation process is a statistic calculation process or a frequency analysis calculation process, in which a peak value of the reproduced data or a threshold value time when exceeding or being below an arbitrary threshold value is measured using the converted digital data, thereby to calculate an average value or a dispersion value or a deviation value or a cumulative frequency with respect to the peak value or the threshold value time.

6. A testing apparatus of a magnetic head for conducting a test on the magnetic head through recording testing data onto a magnetic recording medium by means of the magnetic head, reproducing the recorded testing data by means of the magnetic head, and performing a predetermined process on the reproduced testing data, wherein:

the reproduced testing data is converted into digital data by using a plurality of analog-to-digital converters each provided with a predetermined sampling clock for sampling the reproduced testing data; and a calculation process is performed on the converted digital data in relation to a magnetic characteristic of the magnetic recording medium thereby conducting the test on the magnetic head, the calculating process calculating at least an amplitude value of each pulse or an average amplitude thereof, which is obtained through reproduction from the magnetic recording medium, or a pulse width at an arbitrary threshold value or an average pulse width thereof.

7. A testing apparatus of a magnetic head according to claim 6, wherein the calculation process is a statistic calculation process or a frequency analysis calculation process, in which a peak value of the reproduced testing data or a threshold value time when exceeding or being below an arbitrary threshold value is measured using the converted digital data, thereby to calculate an average value or a dispersion value or a deviation value or a cumulative frequency with respect to the peak value or the threshold value time.

8. A testing apparatus of a magnetic head according to claim 6, further comprising:

holding means for holding the digital data converted by plurality of analog-to-digital converters; and data processing means for performing the calculation process on the digital data held in the holding means in relation to the magnetic characteristic of the magnetic recording medium, thereby conducting the test on the magnetic head.

9. A testing apparatus of a magnetic head for conducting a test on the magnetic head by using reproduced data obtained by reproduction of a magnetic recording medium by means of the magnetic head comprising:

a plurality of conversion means for converting the reproduced data into digital data, each conversion means provided with a predetermined sampling clock for sampling the reproduced data;

holding means for holding the digital value converted by the plurality of conversion means;

data processing means for performing a calculation process on the digital data held in the holding means in relation to a magnetic characteristic of the magnetic recording medium, the calculating process calculating at least an amplitude value of each pulse or an average amplitude thereof, which is obtained through reproduction from the magnetic recording medium, or a pulse width at an arbitrary threshold value or an average pulse width thereof, by using the digital data held in the holding means; and analysis processing means for performing an analysis to determine whether information obtained by the data processing means satisfies a certain condition.

10. A testing apparatus of a magnetic head according to claim 9, wherein the calculation process is a statistic calculation process or a frequency analysis calculation process, in which a peak value of the reproduced data or a threshold value time when exceeding or being below an arbitrary threshold value is measured using the converted digital data, thereby to calculate an average value or a dispersion value or a deviation value or a cumulative frequency value with respect to the peak value or the threshold value time.

11. A testing apparatus of a magnetic recording medium for conducting a test on the magnetic recording medium by using reproduced data obtained through reproduction from the magnetic recording medium, comprising:

a reproduced signal distribution circuit for distributing the reproduced data obtained through reproduction from the magnetic recording medium;

a plurality of converter circuits, each provided with a predetermined sampling clock, for converting the reproduced data into digital data;

a memory for holding the digital data converted by the converter circuits;

a data processing portion for performing a calculation process on the digital data held by the memory in relation to a magnetic characteristic of the magnetic recording medium; and an analysis processing portion for performing an analysis to determine whether information obtained by the data processing portion satisfies a certain condition.

12. A testing apparatus of a magnetic recording medium according to claim 11, wherein at least an average amplitude of the reproduced data is calculated at the data processing portion, by processing histogram calculation on the reproduced data.

13. A testing apparatus of a magnetic recording medium according to claim 11, further comprising a plurality of magnetic heads arranged opposite to the magnetic recording medium, each of the magnetic heads reading the data recorded in a different area of the magnetic recording medium.

14. A testing apparatus of a magnetic recording medium for conducting a test on the magnetic recording medium by using reproduced data obtained through reproduction from the magnetic recording medium, comprising:

a reproduced signal distribution circuit for distributing the reproduced data obtained through reproduction from the magnetic recording medium;

a plurality of converter circuits for converting the reproduced data into digital data;

a memory for holding the digital data converted by the converter circuits;

a data processing portion for performing a calculation process on the digital data held by the memory in relation to a magnetic characteristic of the magnetic recording medium;

an analysis processing portion for performing an analysis to determine whether information obtained by the data processing portion satisfies a certain condition; and a mode exchange portion for conducting change-over between a write-in mode signal for writing data onto the magnetic recording medium and a read-out mode signal for reading out data from the magnetic recording medium;

wherein the mode exchange portion provides the write-in mode signal to a magnetic head, while inhibiting read-out of the data by the magnetic head during a write-in mode; and wherein the mode exchange portion provides one of the read-out mode signal and a sampling clock during a period of a read-out mode to the plurality of converter circuits, while inhibiting write-in of data onto the magnetic recording medium during the read-out mode.

15. A testing apparatus of a magnetic recording medium according to claim 12, wherein an average pulse width is measured on the reproduced data at a point 50% of the average amplitude, by using the average amplitude of the reproduced data calculated.

16. A testing apparatus of a magnetic recording medium for conducting a test on the magnetic recording medium by using reproduced data obtained through reproduction from the magnetic recording medium, comprising:

a reproduced signal distribution circuit for distributing the reproduced data obtained through reproduction from the magnetic recording medium;

a plurality of converter circuits for converting the reproduced data into digital data;

a memory for holding the digital data converted by the converter circuits; and a data processing portion for performing a calculation process on the digital data held by the memory in relation to a magnetic characteristic of the magnetic recording medium;

wherein a number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the converter circuits, $$N \geq M \times f_{in}/f_{ADC}$$

and N is an integer.

17. A testing apparatus of a magnetic recording medium for conducting a test on the magnetic recording medium by using reproduced data obtained through reproduction from the magnetic recording medium, comprising:

a reproduced signal distribution circuit for distributing the reproduced data obtained through reproduction from the magnetic recording medium;

a plurality of converter circuits for converting the reproduced data into digital data;

a memory for holding the digital data converted by the converter circuits;

data processing means for performing a calculation process on the digital data held by the memory in relation to a magnetic characteristic of the magnetic recording medium;

rotation control means for controlling rotation of the magnetic recording medium based on a first variable oscillation frequency;

recording means for recording the data onto the magnetic recording medium, by the magnetic head;

reproducing means for reproducing the data recorded onto the magnetic recording medium by the magnetic head;

sampling clock distributing means for distributing a predetermined sampling clock having a sampling frequency $f_{ADC}$ to each of the converter circuits by means of a clock signal based on a second variable oscillation frequency; and control means for bringing the first and second variable oscillation frequencies and the sampling frequency for operating the converter circuits to be exchangeable, where a number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the converter circuits, $$N \geq M \times f_{in}/f_{ADC}$$

and N is an integer.

18. A testing apparatus of a magnetic recording medium for conducting a test on the magnetic recording medium by using reproduced data obtained through reproduction from the magnetic recording medium, comprising;
  a reproduced signal distribution circuit for distributing the reproduced data obtained through reproduction from the magnetic recording medium;
  a plurality of converter circuits for converting the reproduced data into digital data;
  a memory for holding the digital data converted by the converter circuits;
  data processing means for performing a calculation process on the digital data held by the memory in relation to a magnetic characteristic of the magnetic recording medium;
  rotation control means for controlling rotation of the magnetic recording medium based on a first variable oscillation frequency;
  mode and timing control means for generating a write-in mode signal indicative of a start and an end of writing and a read-out mode signal indicative of a start and an end of reading, responding to a start signal and a stop signal, based on an index signal indicative of a rotation number and an encode signal indicative of a rotating position from the rotation control means;
  recording means for recording the data onto the magnetic recording medium, by the magnetic head, based on the write-in mode signal;
  reproducing means for reproducing the data recorded onto the magnetic recording medium by the magnetic head, based on the read-out mode signal;
  reproduction signal distributing means for distributing the reproduced data to the plurality of converter circuits;
  sampling clock distributing means for distributing a predetermined sampling clock having a sampling frequency $f_{ADC}$ to each of the plurality of converter circuits by means of a clock signal based on a second variable oscillation frequency; and
  control means for bringing the first and second variable oscillation frequencies and the sampling frequency for operating the plurality of converter circuits to be changeable, where a number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the plurality of converter circuits, $$N \geq M \times f_{in}/f_{ADC}$$

and N is an integer.

19. A testing apparatus of a magnetic recording medium for conducting a test on the magnetic recording medium by using reproduced data obtained through reproduction from the magnetic recording medium, comprising:
  a converter circuit for converting the reproduced data obtained through reproduction from the magnetic recording medium into digital data;
  first frequency measuring means for selectively operating a plurality of frequency counters to measure, based on the converted digital data;
  first histogram processing means for outputting an average amplitude value of a reproduced waveform by means of a histogram process, based on an output of the first frequency measuring means;
  coefficient means for multiplying a coefficient of ½ onto an output of the first histogram processing means;
  comparator means for comparing an output of the coefficient means and an output of the converter circuit, to output a comparison result;
  pulse counting means for counting pulses of a clock signal oscillating at a desired frequency, during a period when the comparison result of the comparator means is at a predetermined level;
  second frequency measuring means, operative based on a change of an output of the comparator means, for selectively operating a plurality of frequency counters to measure, based on the pulses outputted by the pulse counting means; and
  second histogram processing means for outputting an average amplitude value of the reproduced waveform by means of a histogram process based on an output of the second frequency measuring means, wherein the average amplitude value and the average pulse width of the reproduced waveform during a desired time period is measured, thereby conducting the test on the magnetic recording medium.

20. A testing apparatus of a magnetic recording medium for conducting a test on the magnetic recording medium by using reproduced data obtained through reproduction from the magnetic recording medium, comprising:
  a converter circuit for converting the reproduced data obtained through reproduction from the magnetic recording medium into digital data;
  first frequency measuring means for measuring frequency, by adding data written into an address of a first memory corresponding to the converted digital data and writing the data into the same address, based on the converted digital data;
  first histogram processing means for outputting an average amplitude value of a reproduced waveform by means of a histogram process, based on an output of the first frequency measuring means;
  threshold holding means for holding predetermined threshold data;
  comparator means for comparing an output of the threshold holding means and an output of the converter circuit, to output a comparison result;
  pulse counting means for counting pulses of a clock signal oscillating at a desired frequency, during a period when the comparison result of the comparator means is at a predetermined level;
  second frequency measuring means for measuring frequency, by adding data written into an address of a second memory corresponding to the converted digital data, and by writing the data into the same address, based on an output of the pulse counting means; and second histogram processing means for measuring and outputting an average amplitude value of a reproduced waveform, by means of a histogram process, based on an output of the second frequency measuring means, wherein the average amplitude value and the average pulse width of the reproduced waveform during a desired time period is measured, thereby conducting the test on the magnetic recording medium.

21. A testing apparatus of a magnetic head for conducting a test on the magnetic head by using reproduced data obtained through reproduction from a magnetic recording medium by means of the magnetic head, comprising:

a reproduced signal distribution circuit for distributing the reproduced data obtained through reproduction from the magnetic recording medium;

a plurality of converter circuits for converting the reproduced data into digital data;

holding means for holding the digital data converted by the plurality of converter circuits;

data processing means for performing a calculation process on the digital data held by the holding means in relation to a magnetic characteristic of the magnetic recording medium; and analysis processing means for performing an analysis to determine whether information obtained by the data processing means satisfies a certain condition, wherein each of the plurality of converter circuits provided with a predetermined sampling clock, which is necessary for sampling of the reproduced data.

22. A testing apparatus of a magnetic head according to claim 21, wherein at least an average amplitude of the reproduced data is calculated at the data processing means, by processing histogram calculation on the reproduced data.

23. A testing apparatus of a magnetic head according to claim 22, wherein an average pulse width is measured on the reproduced data at a point 50% of the average amplitude, by using the average amplitude of the reproduced data calculated.

24. A testing apparatus of a magnetic head according to claim 21, further comprising a plurality of magnetic heads positioned opposite to the magnetic recording medium, each of the magnetic heads reading the data recorded in a different area of the magnetic recording medium.

25. A testing apparatus of a magnetic head for conducting a test on the magnetic head by using reproduced data obtained through reproduction from a magnetic recording medium by means of the magnetic head, comprising:

a reproduced signal distribution circuit for distributing the reproduced data obtained through reproduction from the magnetic recording medium;

a plurality of converter circuits for converting the reproduced data into digital data;

holding means for holding the digital data converted by the plurality of converter circuits;

data processing means for performing a calculation process on the digital data held by the holding means in relation to a magnetic characteristic of the magnetic recording medium; and mode exchange means for conducting change over between a write-in mode signal for writing data onto the magnetic recording medium and a read-out mode signal for reading data from the magnetic recording medium;

wherein the mode exchange means provides the write-in mode signal to a magnetic head, while inhibiting read-out of the data by the magnetic head during a write-in mode; and wherein the mode exchange means provides either one of the read-out mode signal and the sampling clock during a period of a read-out mode to the plurality of converter circuits, while inhibiting write-in of data onto the magnetic recording medium during the read-out mode.

26. A testing apparatus of a magnetic head for conducting a test on the magnetic head by using reproduced data obtained through reproduction from a magnetic recording medium by means of the magnetic head, comprising:

a reproduced signal distribution circuit for distributing the reproduced data obtained through reproduction from the magnetic recording medium;

a plurality of converter circuits for converting the reproduced data into digital data;

holding means for holding the digital data converted by the plurality of converter circuits;

data processing means for performing a calculation process on the digital data held by the holding means in relation to a magnetic characteristic of the magnetic recording medium;

wherein a number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the converter circuits, $$N \geq M \times f_{in}/f_{ADC}$$

and N is an integer.

27. A testing apparatus of a magnetic head for conducting a test on the magnetic head by using reproduced data obtained through reproduction from a magnetic recording medium by means of the magnetic head, comprising:

a reproduced signal distribution circuit for distributing the reproduced data obtained through reproduction from the magnetic recording medium;

a plurality of converter circuits for converting the reproduced data into digital data;

holding means for holding the digital data converted by the plurality of converter circuits;

data processing means for performing a calculation process on the digital data held by the holding means in relation to a magnetic characteristic of the magnetic recording medium;

rotation control means for controlling rotation of the magnetic recording medium based on a first variable oscillation frequency;

recording means for recording the data onto the magnetic recording medium, by the magnetic head;

reproducing means for reproducing the data recorded onto the magnetic recording medium by the magnetic head;

sampling clock distributing means for distributing a predetermined clock signal having a sampling frequency $f_{ADC}$ to each of the converter circuits by means of a clock signal based on a second variable oscillation frequency; and control means for bringing the first and second variable oscillation frequencies and the sampling frequency for operating the converter circuits to be exchangeable, where the number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the converter circuits, $N \geq M \times f_{in}/f_{ADC}$ and N is an integer.

28. A testing apparatus of a magnetic head for conducting a test on the magnetic head by using reproduced data obtained through reproduction from a magnetic recording medium by means of the magnetic head, comprising:

a reproduced signal distribution circuit for distributing the reproduced data obtained through reproduction from the magnetic recording medium;

a plurality of converter circuits for converting the reproduced data into digital data;

holding means for holding the digital data converted by the reality of converter circuits;

data processing means for performing a calculation process on the digital data held by the holding means in relation to a magnetic characteristic of the magnetic recording medium;

rotation control means for controlling rotation of the magnetic recording medium based on a first variable oscillation frequency;

mode and timing control means for generating a write-in mode signal indicative of a start and an end of writing and a read-out mode signal indicative of a start and an end of reading, responding to a start signal and a stop signal, based on an index signal indicative of a rotation number and an encode signal indicative of a rotating position from the rotation control means;

recording means for recording the data onto the magnetic recording medium, by the magnetic head, based on the write-in mode signal;

reproducing means for reproducing the data recorded onto the magnetic recording medium by the magnetic head, based on the read-out mode signal;

reproduction signal distributing means for distributing the reproduced data to the plurality of converter circuits;

sampling clock distributing means for distributing a predetermined sampling clock having a sampling frequency $f_{ADC}$ to each of the plurality of converter circuits, by means of a clock signal based on a second variable oscillation frequency; and control means for bringing the first and second variable oscillation frequencies and the sampling frequency for operating the plurality of converter circuits to be changeable, where a number N of the plurality of converter circuits has a following relationship among M, being a ratio of a sampling frequency $f_s$ as an object with respect to a frequency $f_{in}$ of the reproduced data, the frequency $f_{in}$ and a sampling frequency $f_{ADC}$ for operating the plurality of converter circuits, $N \geq M \times f_{in}/f_{ADC}$ and N is an integer.

29. A testing apparatus of a magnetic head for conducting a test on the magnetic head by using reproduced data obtained through reproduction from a magnetic recording medium by means of the magnetic head, comprising:

a converter circuit for converting the reproduced data obtained through reproduction from the magnetic recording medium into digital data;

first frequency measuring means for selectively operating a plurality of frequency counters to measure, based on the converted digital data;

first histogram processing means for outputting an average amplitude value of a reproduced waveform by means of a histogram process, based on an output of the first frequency measuring means;

coefficient means for multiplying a coefficient of ½ onto an output of the first histogram processing means;

comparator means for comparing an output of the coefficient means and an output of the converter circuit, to output a comparison result;

pulse counting means for counting pulses of a clock signal oscillating at a desired frequency, during a period when the comparison result of the comparator means is at a predetermined level;

second frequency measuring means, operative based on a change of an output of the comparator means, for selectively operating a plurality of frequency counters to measure, based on the pulses outputted by the pulse counting means; and second histogram processing means for outputting an average amplitude value of the reproduced waveform by means of a histogram process based on an output of the second frequency measuring means, wherein the average amplitude value and the average pulse width of the reproduced waveform during a desired time period is measured, thereby conducting the test on the magnetic recording medium.

30. A testing apparatus of a magnetic head for conducting a test on the magnetic head by using reproduced data obtained through reproduction from a magnetic recording medium by means of the magnetic head, comprising:

a converter circuit for converting the reproduced data obtained through reproduction from the magnetic recording medium into digital data;

first frequency measuring means for measuring frequency, by adding data written into an address of a first memory corresponding to the converted digital data, and writing the data into the same address, based on the converted digital data;

first histogram processing means for outputting an average amplitude value of a reproduced waveform by means of a histogram process, based on an output of the first frequency measuring means;

threshold holding means for holding predetermined threshold data;

comparator means for comparing an output of the threshold holding means and an output of the converter circuit, to output a comparison result;

pulse counting means for counting pulses of a clock signal oscillating at a desired frequency, during a period when the comparison result of the comparator means is at a predetermined level;

second frequency measuring means for measuring frequency, by adding data written into an address of a second memory corresponding to the converted digital data, and by writing the same into the same address, based on an output of the pulse counting means; and second histogram processing outputting a value of average amplitude of a reproduced waveform, by means of a histogram process, based on an output of the second frequency measuring means, wherein the average amplitude value and the average pulse width of the reproduced waveform during a desired time period is measured, thereby conducting the test on the magnetic recording medium.

* * * * *